(12) United States Patent
Gritters et al.

(10) Patent No.: US 8,691,099 B2
(45) Date of Patent: *Apr. 8, 2014

(54) PROCESS FOR FABRICATING MEMS DEVICES

(76) Inventors: John Gritters, Livermore, CA (US); Ezekiel John Joseph Kruglick, Poway, CA (US); Mathew Last, San Diego, CA (US)

( * ) Notice: Subject to any disclaimer, the term of this patent is extended or adjusted under 35 U.S.C. 154(b) by 282 days.

This patent is subject to a terminal disclaimer.

(21) Appl. No.: 12/930,840

(22) Filed: Jan. 18, 2011

(65) Prior Publication Data

US 2011/0136283 A1 Jun. 9, 2011

Related U.S. Application Data

(63) Continuation-in-part of application No. 10/319,403, filed on Dec. 12, 2002, now Pat. No. 7,872,394, which is a continuation-in-part of application No. 10/191,041, filed on Jul. 2, 2002, now abandoned, and a continuation-in-part of application No. 10/190,083, filed on Jul. 2, 2002, now abandoned.

(60) Provisional application No. 60/340,318, filed on Dec. 13, 2001, provisional application No. 60/340,677, filed on Dec. 13, 2001.

(51) Int. Cl.
*C23F 1/00* (2006.01)

(52) U.S. Cl.
USPC ............ 216/2; 216/11; 216/24; 310/309

(58) Field of Classification Search
USPC ............ 204/192.37; 216/11, 2, 24; 257/729; 310/309; 356/497; 359/201.1, 221.2, 359/245; 385/133, 18; 438/114, 427, 50; 73/597

See application file for complete search history.

(56) References Cited

U.S. PATENT DOCUMENTS

| | | | |
|---|---|---|---|
| 6,177,331 B1 * | 1/2001 | Koga | 438/424 |
| 7,872,394 B1 * | 1/2011 | Gritters et al. | 310/309 |
| 2001/0048748 A1 * | 12/2001 | Van Ryzin | 381/2 |
| 2002/0005976 A1 * | 1/2002 | Behin et al. | 359/254 |
| 2003/0227700 A1 * | 12/2003 | Mizuno et al. | 359/877 |
| 2007/0241076 A1 * | 10/2007 | Moffat et al. | 216/2 |
| 2011/0303638 A1 * | 12/2011 | Zhang et al. | 216/24 |

* cited by examiner

*Primary Examiner* — Duy Deo
*Assistant Examiner* — Erin Bergner
(74) *Attorney, Agent, or Firm* — John R. Ross; John R. Ross, III

(57) ABSTRACT

A process for fabricating a MEMS device with movable comb teeth and stationary comb teeth. A single mask is used to define, during a series of processing steps, the location and width of both movable comb teeth and stationary comb teeth so as to assure self alignment of the comb teeth. MEMS devices are fabricated from a single multi-layer semi-conductor structure of semiconductor material and insulator material. In a preferred embodiment the process is employed to provide a MEMS mirror device having a movable structure, a movable frame, a first set of two torsional members, a first set of at least four comb drives, an outer fixed frame structure, a second set of two torsional members, and a second set of at least four comb drives.

14 Claims, 30 Drawing Sheets

Start wafer: Double SOI: 25um/1.5um/25um/1um/380um.
All silicon layers p-type, 10-20mOhm-cm Pattern alignment marks, oxide etch, pattern oxide mask, oxide etch, pattern DL2 etch holes, oxide etch, DRIE, oxide etch, Sputter Aluminum.

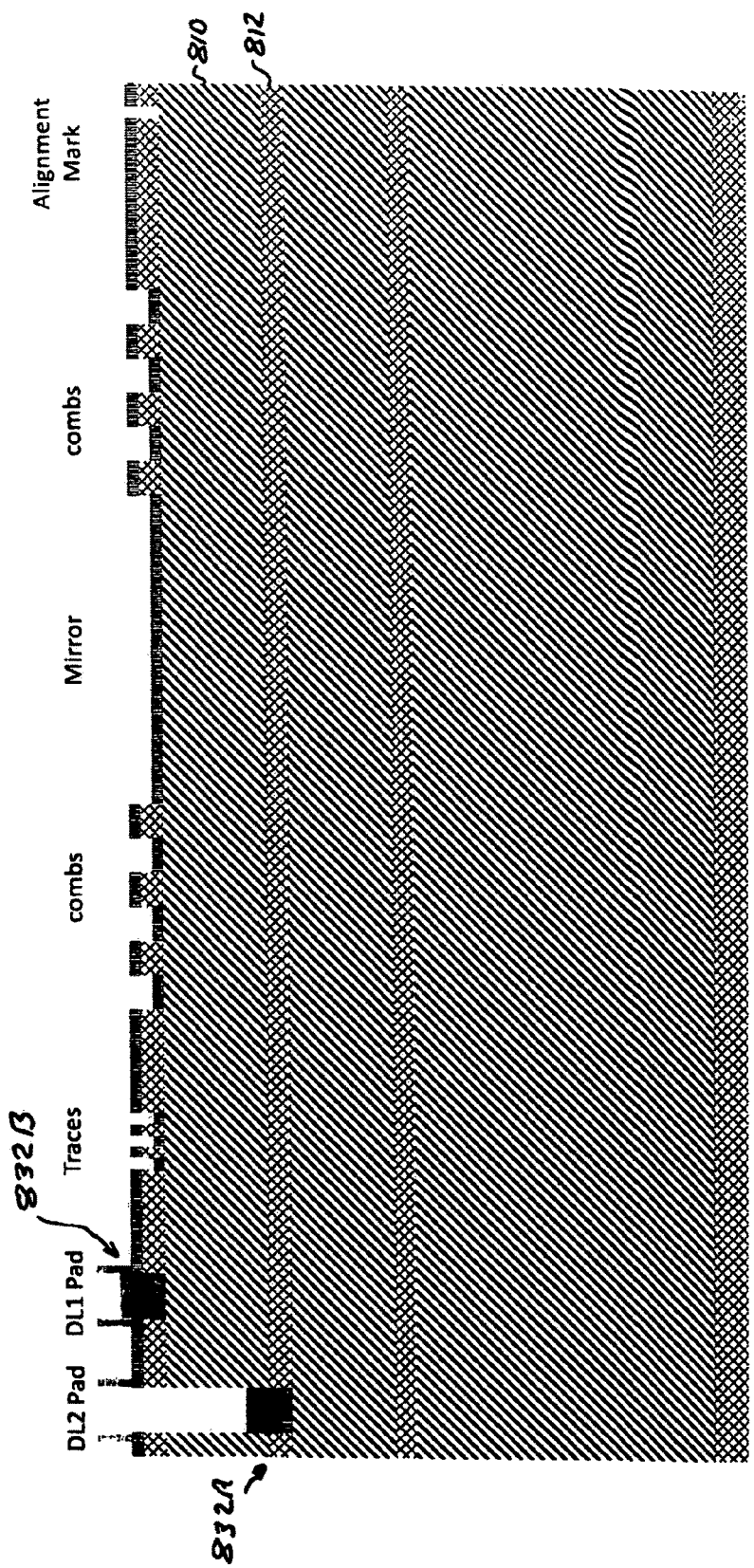

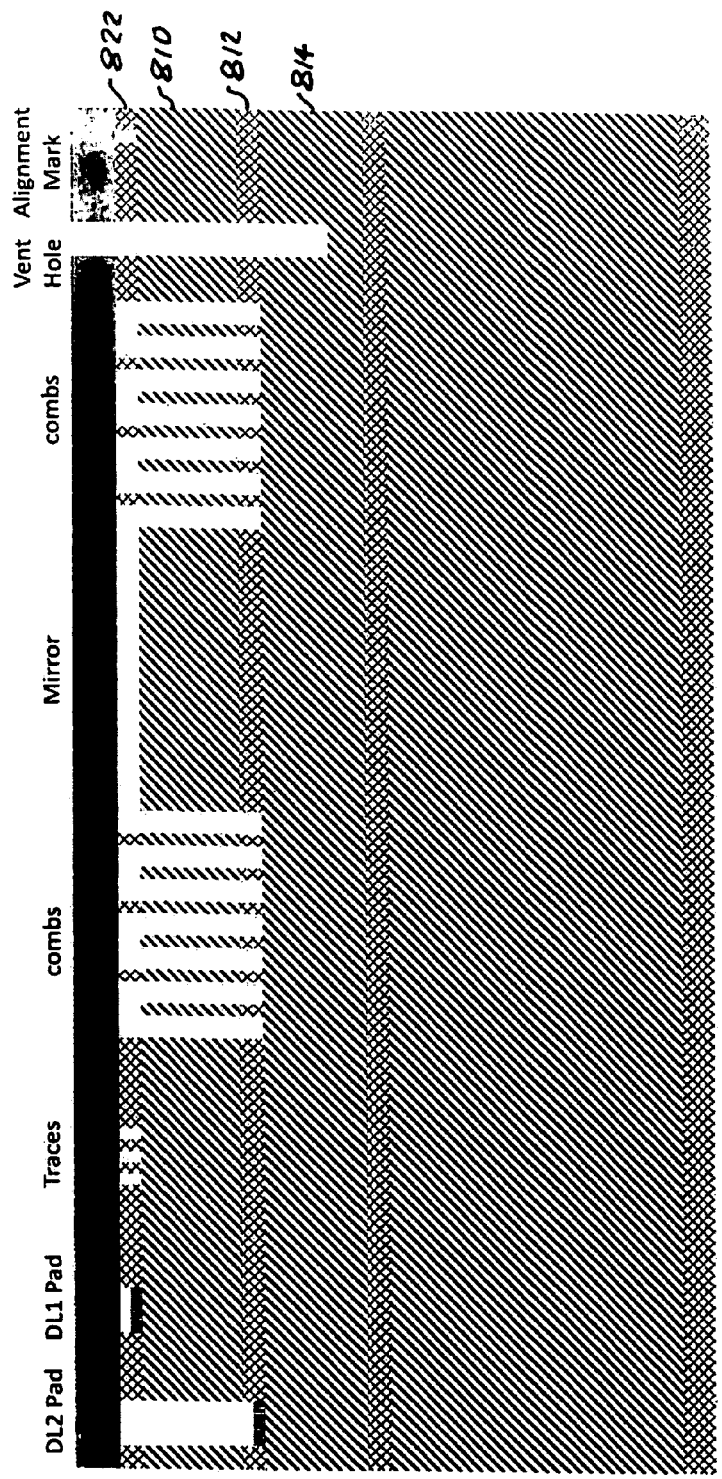

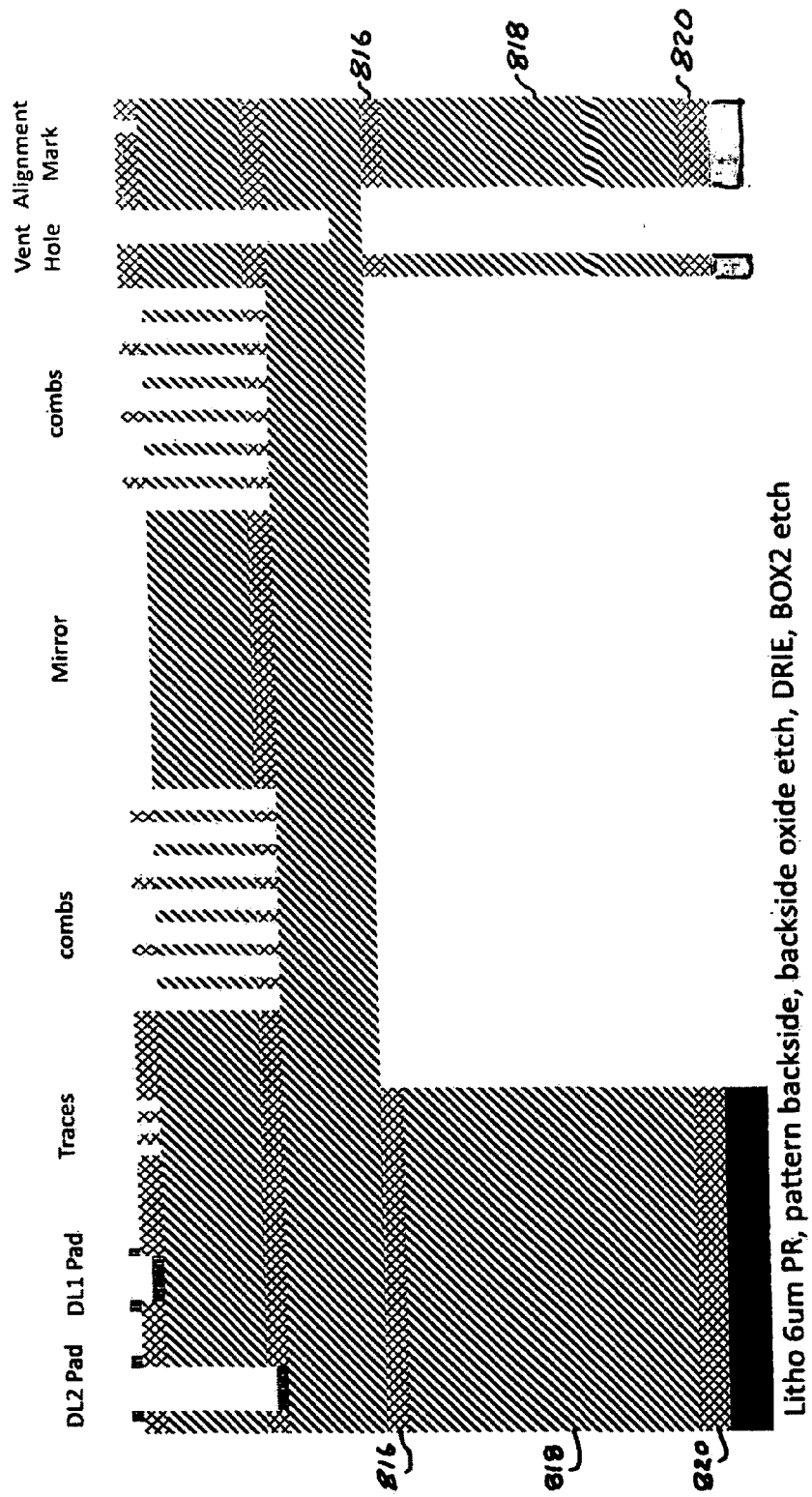

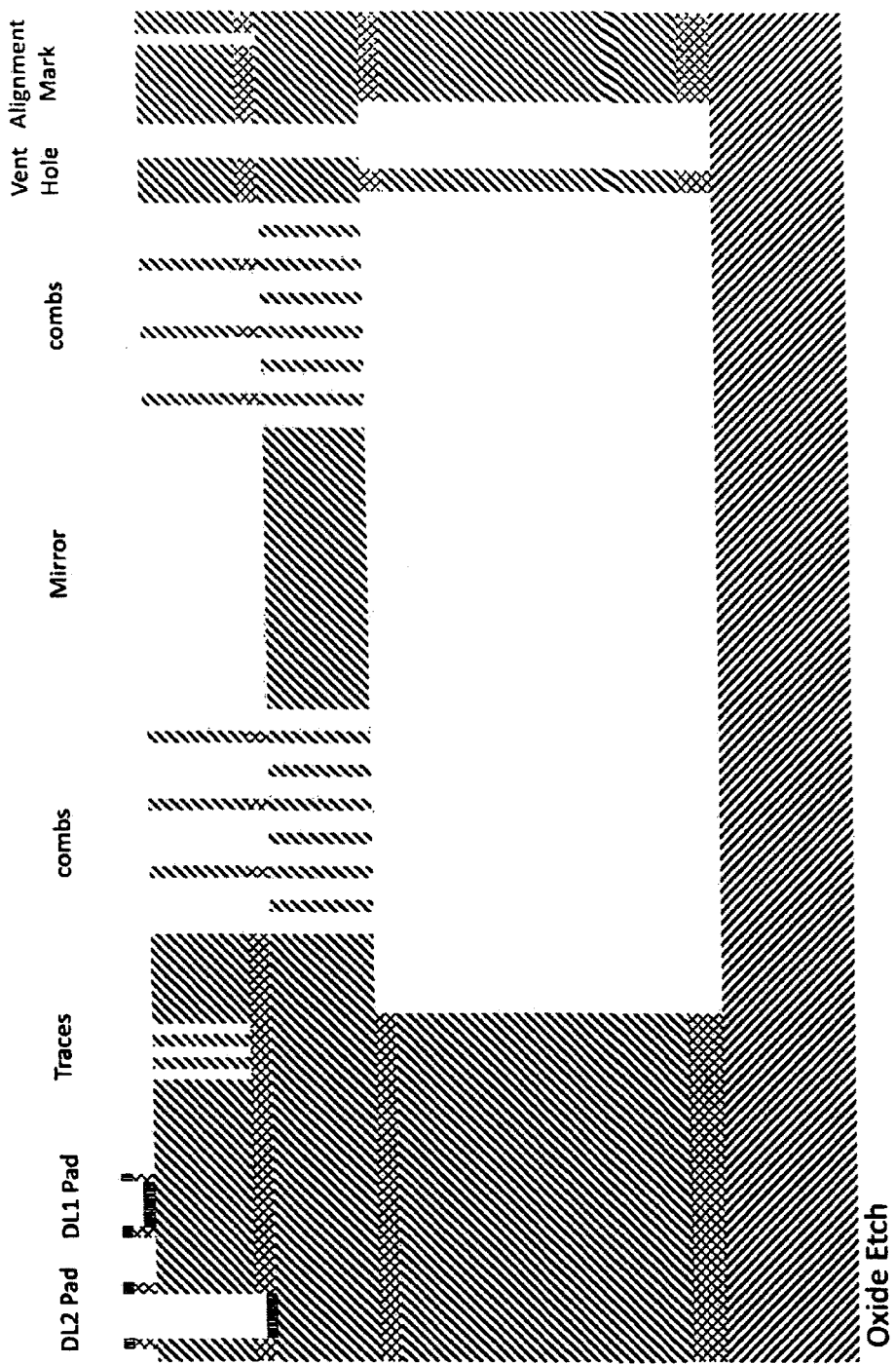

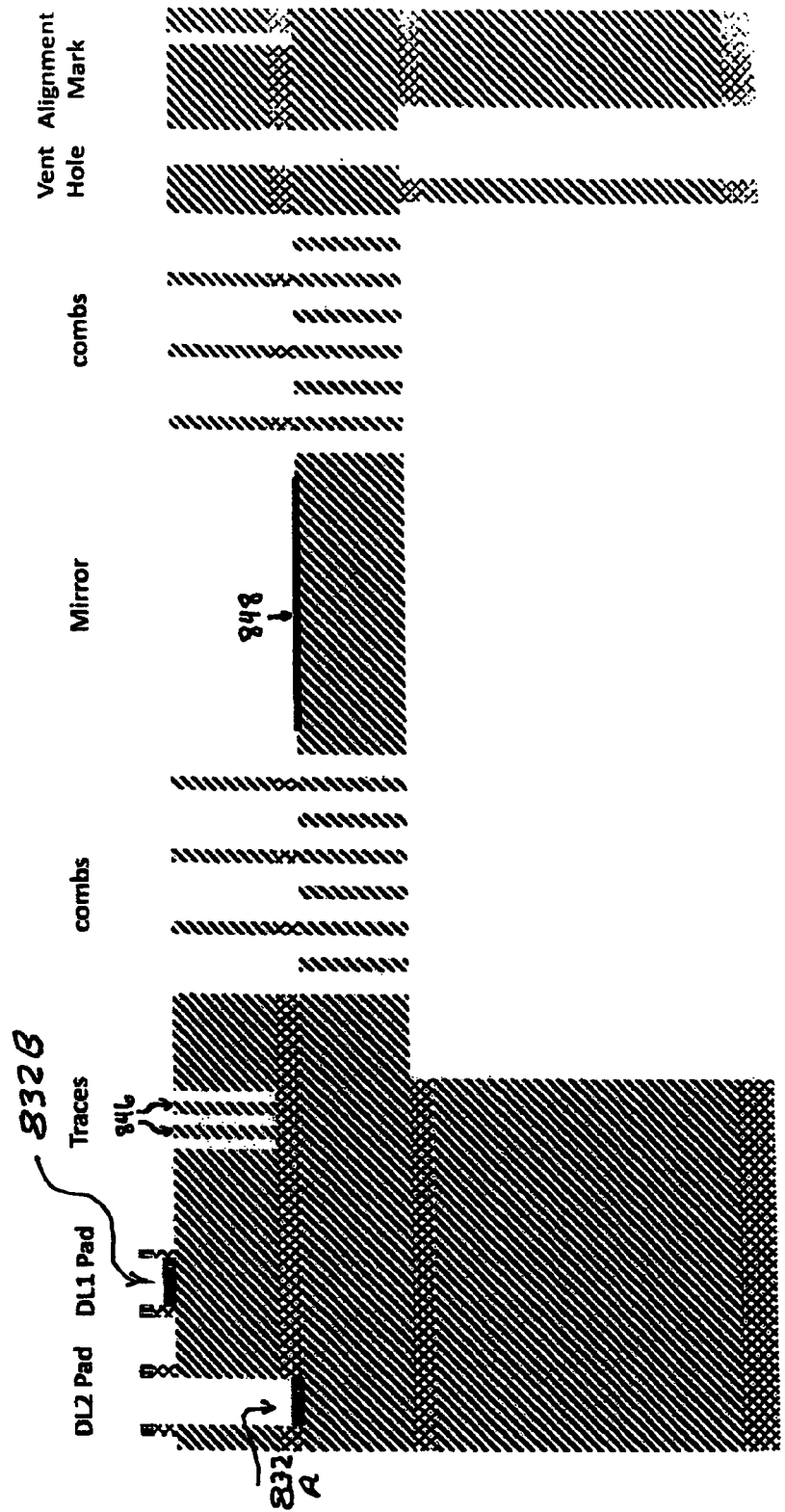

PROCESS FOR FABRICATING MEMS DEVICES

CROSS REFERENCE TO RELATED APPLICATIONS

This application is a continuation in part of Ser. No. 10/319,403 filed Dec. 1, 2002 which claimed the benefit of Ser. No. 60/340,318 filed Dec. 13, 2001, Ser. No. 60/340,677 filed Dec. 13, 2001 and was a continuation in part of Ser. No. 10/191,041 filed Jul. 2, 2002 and Ser. No. 10/190,083 filed Jul. 2, 2002.

FIELD OF THE INVENTION

The present invention relates to micro-electro-mechanical systems (MEMS) which are made up of several micro-machined electrical-mechanical structures having sizes typically in the range of millimeters or smaller.

BACKGROUND OF THE INVENTION

Microelectromechanical systems (MEMS), which are made up of several micromachined electrical-mechanical structures, have a size typically on a millimeter scale or smaller. These micromachined structures are used to produce MEMS devices that are used in a wide variety of applications including, for example, sensing, electrical and optical switching, and micromachinery (such as robotics and motors). MEMS devices utilize both the mechanical and electrical attributes of a material to achieve desired results. Because of their small size, MEMS devices may be fabricated using semiconductor processing methods and other microfabrication techniques, such as thin-film processing and photolithography.

MEMS technology allows movable microelectromechanical parts to be integrated with micro-optical structures to create MEWS optical devices. These MEMS optical devices may be mass produced at low cost using batch fabrication processes. Moreover, because of their small size and low mass, highly efficient optical devices may be produced with optical MEMS technology. By way of example, applications of optical MEMS technology include optical switches, optical data storage, optical scanners and fiber optic sensors.

One example of a MEMS optical device is a planar all-optical switch. An all-optical switch is capable of switching optical signals between input and output channels without the need for opto-electrical signal conversion. In one embodiment, the all-optical switch includes a MEMS structure having a mirrored surfaced mounted on a movable structure and an actuator for providing force to move the mirrored surface. Using the actuator the mirrored surface can be moved to selectively intercept the path of an optical signal. By selectively intercepting the optical signal, it may be directed to a desired output optical fiber. Such optical switches typically move the mirrored surface about a single axis and utilize only two switch positions, to either intercept or not intercept the optical signal.

In another type of all optical switch, two axes actuators are used. Two-axes actuators are capable of rotating the mirrored surface around two substantially orthogonal axes such that the mirror is capable of being positioned in several different positions. Conventional two-axes optical devices use actuation that includes pads located under the mirrored surface for developing an electrostatic force. In order to position the mirrored surface, the pads are charged such that the mirrored surface is attracted to the charged pads. By selectively positioning the mirror, an optical signal may be directed to one of the many locations.

One problem with this pad-type actuator, however, is that an electric force is generated across a relatively large gap between the pad and the backside of the mirror. This gap exists because the pads are located under the mirrored surface and must allow room for mirror displacement. This large gap effectively decreases the amount of force available to move the mirror, resulting in an increased force requirement, necessitating an increase in system voltage and power to drive the actuator pads. Moreover, with pad-type actuators snap-down can occur due to electrostatic instability occurring because the force from the pad can increase faster that the restoring force from the spring.

Another problem with the above discussed pad-type actuator is that there is no independent control of movement around the two axes in which the mirrored surface rotates. Instead, movement around the two axes is coupled as movement of the mirror along one axis changes the gap distance for the pads under different portions of the mirror. This coupled movement severely limits the angle of scan that can be achieved by the mirror. An additional problem with the coupled movement is that disturbances are harder to correct because damping must occur on both axes. Damping must be applied to the non-disturbed axis as well, because movement around the axes are not independent of each other. Therefore, there exist a need for a manufacturable improved two-axes actuator.

SUMMARY OF THE INVENTION

The present invention provides a process for fabricating a MEMS device with movable comb teeth and stationary comb teeth. A single mask is used to define, during a series of processing steps, the location and width of both movable comb teeth and stationary comb teeth so as to assure self alignment of the comb teeth. MEMS devices are fabricated from a single multi-layer semi-conductor structure of semi-conductor material and insulator material. In a preferred embodiment the process is employed to provide a MEMS mirror device having a movable structure, a movable frame, a first set of two torsional members, a first set of at least four comb drives, an outer fixed frame structure, a second set of two torsional members, and a second set of at least four comb drives. In preferred embodiments the multi-layer semi-conductor structure is comprised of at least two silicon layers, defining an upper semi-conductor layer and an intermediate semi-conductor layer, and at least one additional semiconductor layer, defining a bottom layer. The upper semiconductor layer and the intermediate semiconductor layer and the bottom layer are separated by at least two insulator layers.

BRIEF DESCRIPTION OF THE DRAWINGS

FIG. 6A-M illustrate a second implementation of the present invention actually utilized for the fabrication of a MEMS comb drive structures for a high-speed optical switch.

DETAILED DESCRIPTION OF PREFERRED EMBODIMENTS

I. Structural Overview

Although some of the embodiments of the present invention are discussed in terms of optical switching and mirror structures, it is understood and contemplated that the present invention has application in a variety of fields where the use of MEMS technology is desirable. For example, certain embodiments of the present invention may be embodied in electrical devices such as relays and tunable RF filters, in microfluidic devices such as pumps and valves, in actuating and/or scanning devices, or in other devices such as sensors, displays, readers, or equipment such as cameras or medical devices, etc.

The MEMS comb drive actuator of certain embodiments of the present invention allow a wide range of movement and/or accurate positioning of a structure. This allows the actuator to be used in several different applications where such wide range of movement and/or positioning is needed.

Figure 1:
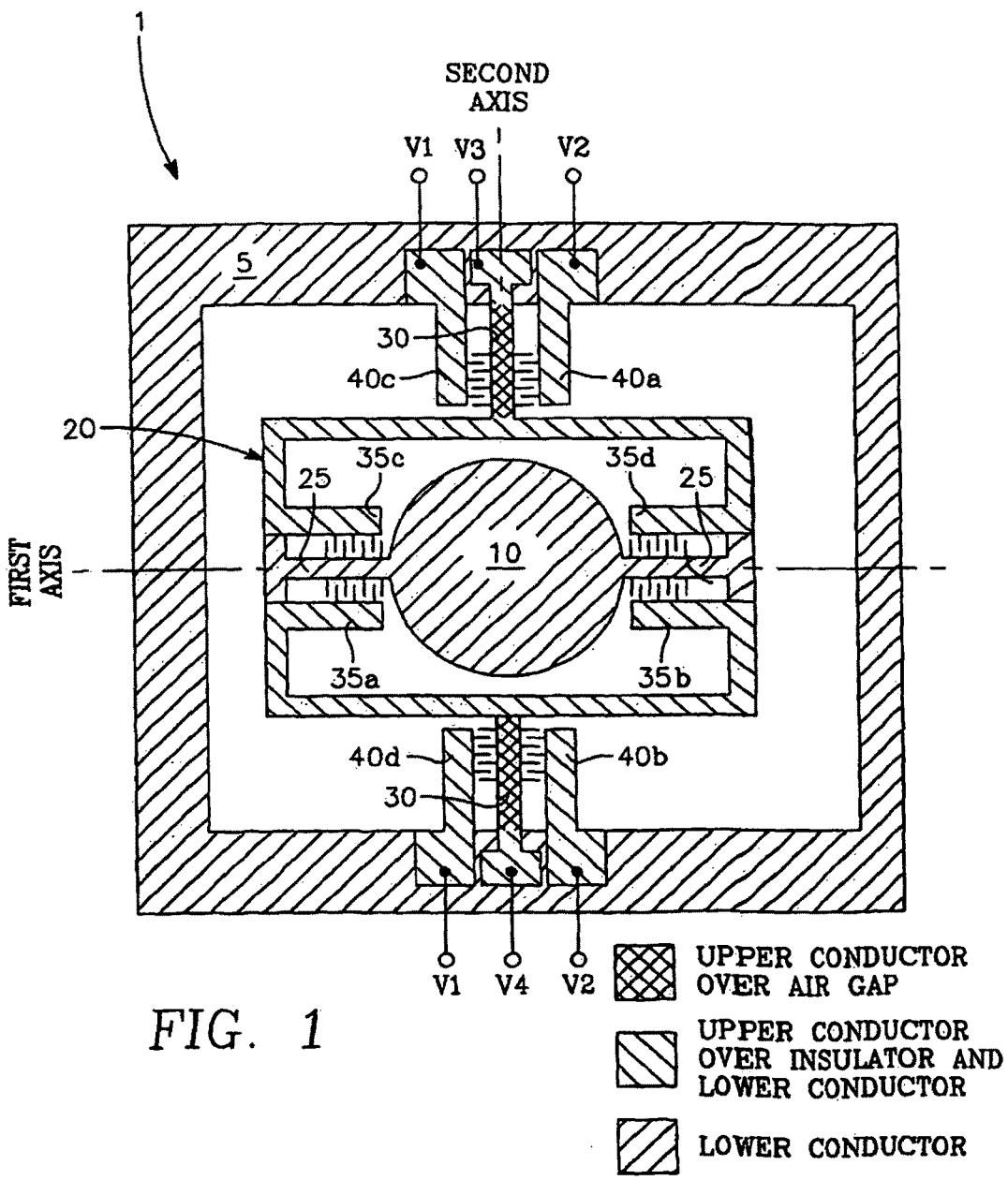
FIG. 1 is a top view of an embodiment of a two-axes torsional comb-drive actuator in accordance with the present invention.

FIG. 1 is a top view of a simplified example of a MEMS torsional comb drive actuator 1 in accordance with an embodiment of the present invention. The MEMS actuator 1 includes an outer fixed frame structure 5 and a movable central structure 10. A movable frame structure 20 is located between the movable central structure 10 and the outer fixed frame structure 5. The movable frame structure 20 is coupled to the fixed frame structure 5 and to the movable central structure 10 so as to allow movement about a first axis (labeled FIRST AXIS in FIG. 1) of the movable central structure 10, independent of the movable frame structure 20. Further, the movable frame structure 20 is coupled to the movable central structure 10 so that it accompanies the movement of the movable central structure 10 about a second axis (labeled SECOND AXIS in FIG. 1). First axis torsional support members 25 couple the movable central structure 10 to the movable frame structure 20. Second axis torsional support members 30 couple the movable frame structure 20 to the outer fixed frame structure 5.

The two-axes MEMS actuator 1 includes comb drives that provide the electrostatic coupling needed for movement. A first axis comb drive system 35 is located near the first axis torsional support members 25. This first axis comb drive system 35 provides movement of the movable central structure 10 around the first axis. A second axis comb drive system 40 is located near the second axis torsional support members 30. The second axis comb drive system 40 provides movement of the movable frame structure 20 around the second axis. In one embodiment, the first axis comb drive system 35 includes two comb drives, one on either side of the first axis torsional support member 25. In addition, the second axis comb drive system 40 can have two comb drives, one located on either side of the second axis torsional support member 30.

In this embodiment, application of a voltage at the V3 and/or V4 terminals will actuate the central movable structure 10 about the first axis. Application of voltage at the V3 terminal supplies actuation voltage to the comb drives 35$c$ and 35$d$. Application of voltage at the V4 terminal supplies actuation voltage to the comb drives 35$a$ and 35$b$.

Application of a voltage at the V1 terminals and/or at the V2 terminals actuates the comb drives about the second axis. Application of voltage to the V1 terminals supplies voltage to the comb drives 40$c$ and 40$d$. Application of voltage to the V2 terminals supplies actuation voltage to the comb drives 40$a$ and 40$b$.

It should be noted that it is possible to operate the actuator 1 using one set of the V1 supplied combs 40$c$ or 40$d$, and one of the set of V2 supplied comb 40$a$ or 40$b$. Likewise, it is possible to operate the actuator 1 using only one of the set of V3 supplied combs 35$c$ or 35$d$, and one of the set of V4 supplied combs 35$a$ or 35$b$.

Figure 2:
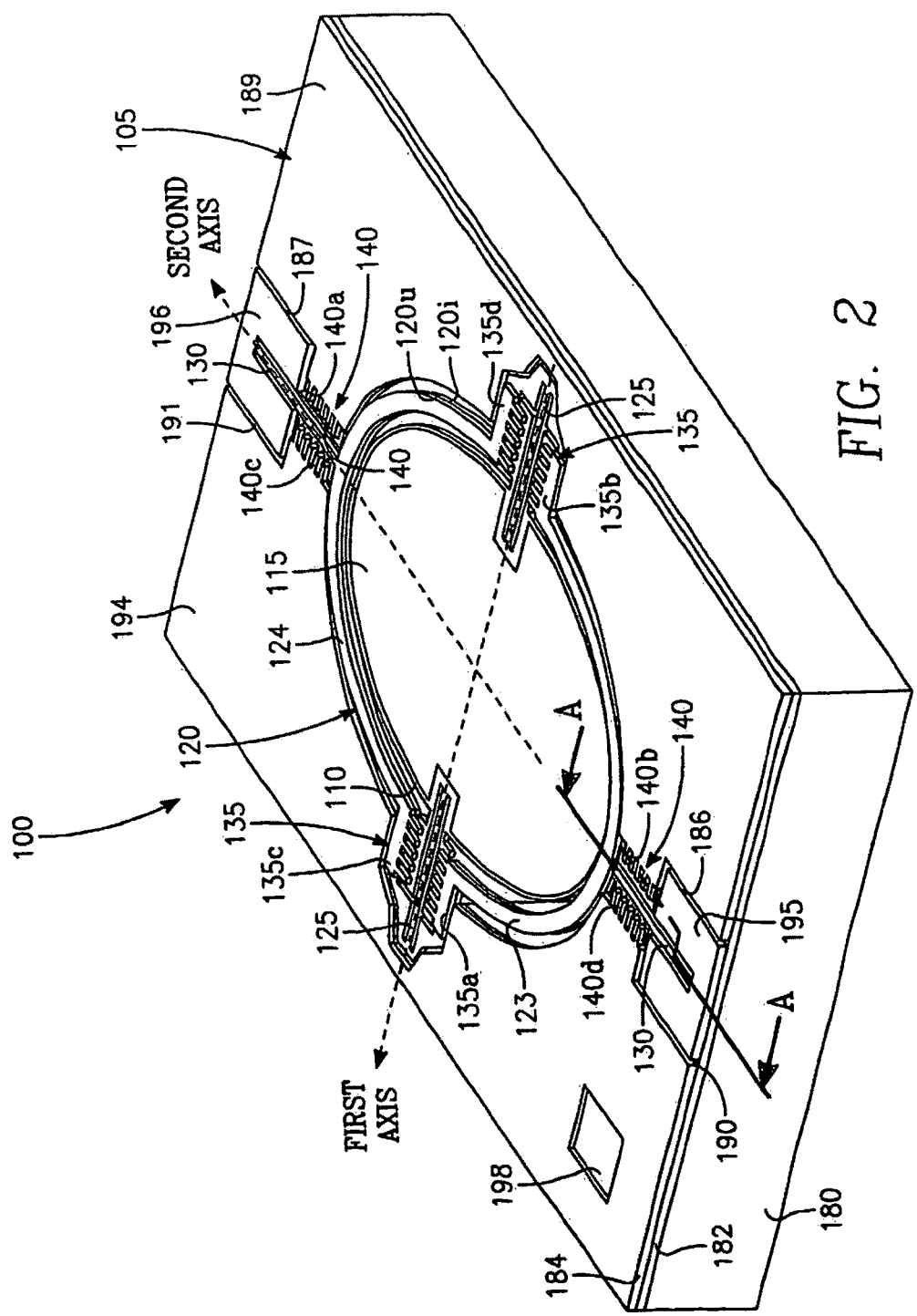
FIG. 2 is an isometric view illustrating an embodiment of the two-axes MEMS torsional comb-drive actuator in accordance with the present invention.

FIG. 2 is an isometric view illustrating an example of a two-axes MEMS torsional comb-drive actuator 100 in accordance with certain embodiments of the present invention. The MEMS actuator 100 includes an outer fixed frame structure 105 and a movable central structure 110. A mirrored surface 115 may be located on the movable central structure 110. In other embodiments, other devices or structures such as a light source, lens, sensors (magnetic, optical, acceleration, or the like), a probe microscopy element, an electron/particle beam steering element, an optical diffraction grating, vertical mirror or other vertical element, or the like may be located on the movable central structure 110. Although shown on a top facing surface of the movable central structure 110, it is possible to locate the mirror or other device on the other side of the movable central structure 110.

Movable frame structure 120 is located between the movable central structure 110 and the outer fixed frame structure 105. The movable frame structure 120 is coupled to the fixed frame structure 105 and to the movable central structure 110 so as to allow movement about a first axis (labeled FIRST AXIS in FIG. 2) of the movable central structure 110, independent of the movable frame structure 120. Further, the movable frame structure 120 is coupled to the movable central structure 110 so that it accompanies the movement of the movable central structure 110 about a second axis (labeled SECOND AXIS in FIG. 1).

First axis torsional support members 125 couple the movable central structure 110 to the movable frame structure 120. Second axis torsional support members 130 couple the movable frame structure 120 to the outer fixed frame structure 105. Although the first and second axes are shown orthogonal in this embodiment, other arrangements are possible.

As discussed further below, the first axis torsional support members 125 include a single support member on opposite sides of the movable central structure 110, while the second axis torsional support members 130 can include two support members on each side of the movable frame structure 120. Each of these torsional support members is aligned with their respective axes. The torsional support members 125 and 130 are flexible about their respective axis. Further, they may provide a restoring force when torsionally deformed along their axis, to apply force to the support member toward its original position.

The movable frame structure 120 has an upper portion 120$u$ and a lower portion 120$i$ separated by an insulator portion (not shown). The upper portion 120$u$ of the movable frame 120 is segmented into two segments 123 and 124. The segment 123 forms part of first axis comb drive portions 135$a$ and 135$b$. The first axis comb drive portions 135$a$ and 135$b$ are attached near the ends of the segment 123 adjacent the first axis. The segment 124 forms part of first axis comb drive portions 135c and 135d. These first axis comb drive portions 135c and 135d are attached near the ends of the segment 124 adjacent the first axis, opposite first axis comb drive portions 135a and 135b, respectively. In this embodiment, the comb drives portions 135a, 135b, 135c, and 135d form the first axis comb drive system 135. Other embodiments are possible where the first axis comb drive system 135 may include less than all of these comb drive portions 135a, 135b, 135c, and 135d.

Figure 4A:
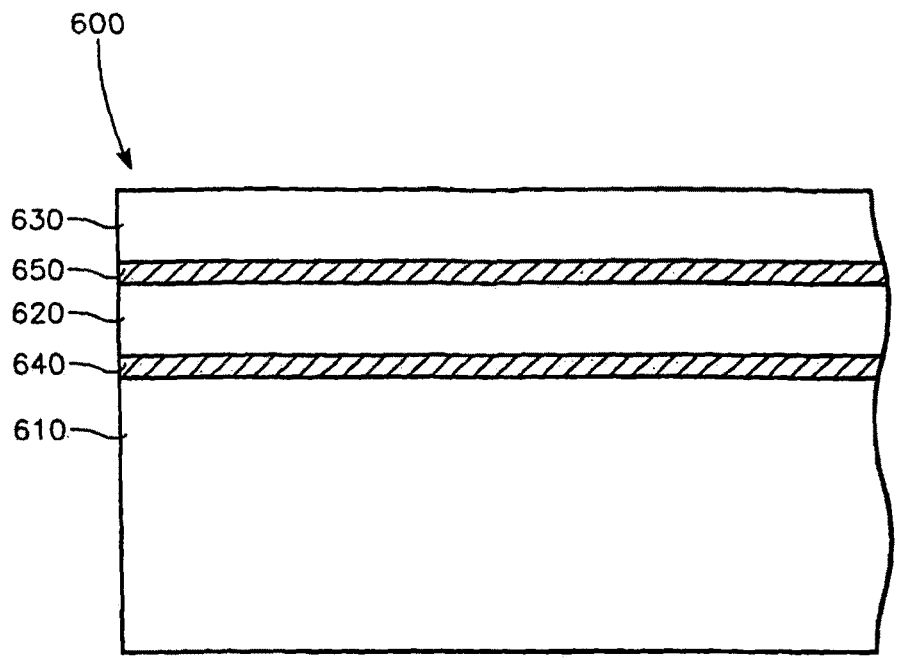
FIGS. 4A-H illustrate a first implementation of a self-aligned process in accordance with the present invention for defining a comb structure.

The MEMS actuator 100 can be fabricated from a layered structure 600, shown in FIG. 4A. In particular, in the embodiment of FIG. 2, the MEMS actuator 100 includes a lower layer 180, which may be a substrate-type layer of silicon or other material such as glass, sapphire, or other substrate material. The MEMS actuator 100 also includes an intermediate layer 182 of conductive micromachinable material, which may be metal, doped semiconductor material, or other conductive material. Over the intermediate layer 182 is an upper layer 184 of conductive micromachinable material, which may be metal, semiconductor material, or other conductive material. Thus, in some embodiments, the MEMS actuator 100 may include three layers 180, 182, and 184 of semiconductor material.

Between the lower layer 180 and the intermediate layer 182 is a first insulator layer (not shown), and between the intermediate layer 182 and the upper layer 184 is a second insulator layer (not shown). The first and second insulator layers 180 and 182 may be dielectric material such as oxide. In some embodiments, the lower layer 180, intermediate layer 182, and the upper layer 184 (and corresponding structures) can be isolated using junction isolation rather than insulator layers. As such, appropriate doping and biasing of structures can be employed to provide electrical isolation between structure layers.

Isolation channels 186, 190, 187, 191 are formed into the upper layer 184. In particular, isolation channels 186 and 187 are formed in the upper layer 184 such that the upper layer 184 has a first isolated area 189. Isolated area 189 allows electrical power to be applied to comb drives 140a and 140b. Similarly, isolation channels 190 and 191 formed in the upper layer 184 so that the upper layer 184 has a second isolated area 194. The second isolated area 194 allow electrical power to be applied to comb drives 140c and 140d.

The isolation channels 186 and 190 also define a third isolated area 195 that allows electrical power to be supplied to the comb drives 135a and 135b coupled to the segment 123. The isolation channels 187 and 191 define a fourth isolated area 196 that allows electrical power to be supplied to the comb drives 135c and 135d on the segment 124. The isolated areas 189, 194, 195, and 196 allow electrical power to independently be supplied to the comb drive systems 135 and 140.

As discussed above, isolated areas 195 and 196 allow application of electrical power to the first axis comb drive system 135. For example, electrical power can be provided to the first axis comb drives 135a and 135b from the third isolated area 195. Thus, electrical power may be applied at the third isolated area 195 and delivered through an associated one of the second axis torsional support members 130, through the segment 123 of the upper portion 120u of the movable frame 120, to the first axis comb drive portions 135a and 135b.

Similarly, electrical power is supplied to the first axis comb drives 135c and 135d through the fourth isolated area 196. Thus, electrical power applied at the fourth isolated area 196 is delivered through the associated one of the second axis torsional support members 130, through the segment 124, to the comb drives 135c and 135d.

The isolated areas 189, 194, 195 and 196 may also be used in conjunction with their respective comb drives to capacitively sense orientation of the movable structure 110 and its associated mirror 115. Position is determined by determining capacitance in each of the comb drives. For example, a comb drive on one side of an axis can be used to provide movement of the actuator around the axis, while a comb drive on the other side of the axis capacitively senses position.

A bond pad 198 can be created on the intermediate layer 182 so that electrical potential can be applied to the intermediate layer 182. An opening formed in the upper layer 184 to allow electrical contact the intermediate layer 182. The bond pad 198 is used to keep the entire bottom layer 182 at the same potential (such as ground).

Figure 2A:
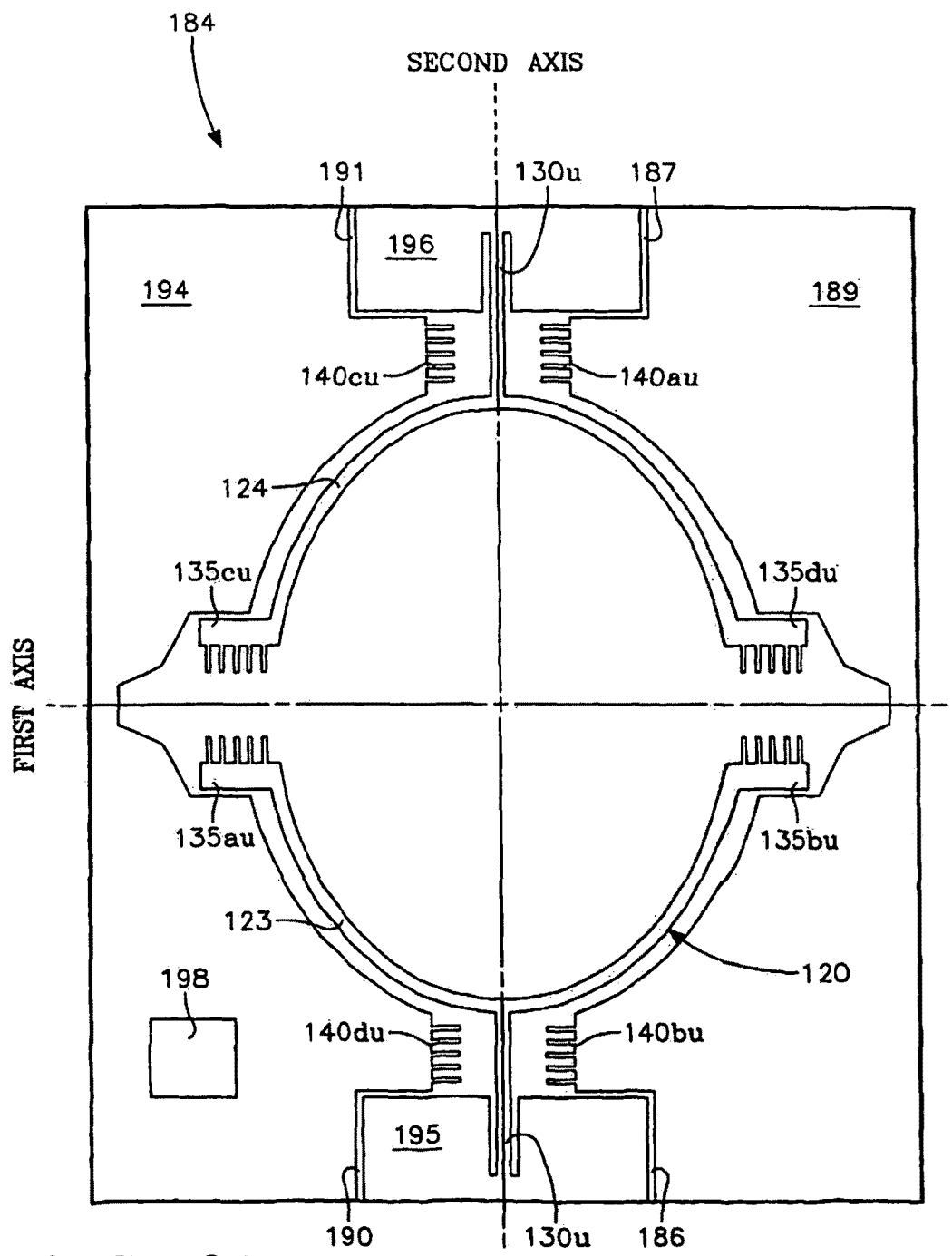
FIG. 2A is a plan view of an upper layer of the MEMS actuator shown in FIG. 2.

FIG. 2A is a plan view of the upper layer 184 of the MEMS actuator shown in FIG. 2. Referring to FIGS. 2 and 2A, the fixed frame structure 105 is divided into separate electrically isolated areas 189, 194, 195, and 196 by the isolation channels 186, 187, 190, 191. More specifically, isolation channel 186 and the isolation channel 187 that forms the first isolated area 189. The first isolated area 189 allows coupling of electrical power to upper portions 140au and 140bu the comb drives 140a and 140b. Furthermore, isolation channels 190 and 191 form the second isolated area 194. The second isolated area 194 allows coupling of electrical power to upper portions 140cu and 140du of comb drives 140c and 140d. The isolation channel 186 and the isolation channel 190 serve to electrically isolate the third isolated area 195 from the first isolated area 189 and from the second isolated area 194. This allows electrical power to be applied at the third isolated area 195 for coupling to upper portions 135au and 135bu of the comb drives 135a and 135b. The isolation channels 187 and 191 electrically isolate the fourth isolated area 196 from the first isolated area 189 and from the second isolated area 194. The fourth isolated area 196 allows electrical power to be applied to upper portions 135cu and 135du of the comb drives 135c and 135d. Upper portions 135au-135du and upper portions 140au-140du formed from upper layer 184 are upper portions of fixed comb teeth (discussed further below with reference to FIGS. 3A and 3B) of the comb drive systems 135 and 140.

Figure 2B:
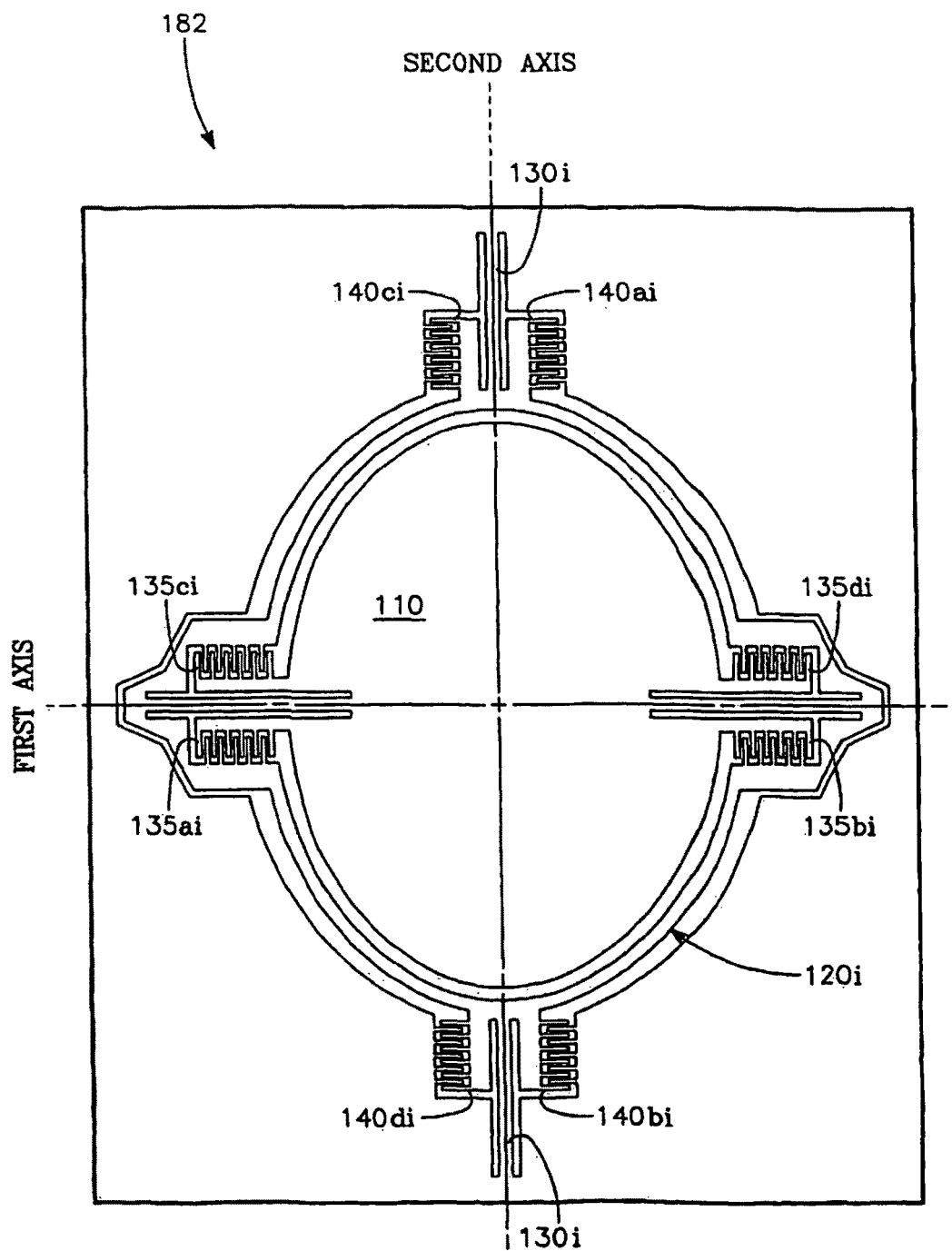
FIG. 2B is a plan view of an intermediate layer of the HEMS actuator shown in FIG. 2.

A portion of the upper layer 184 is removed to allow access through the upper layer 184 to an intermediate layer 182, shown in FIG. 2B, for wire bonding to the intermediate layer 182.

FIG. 2B is a plan view of the intermediate layer 182 of the MEMS actuator shown in FIG. 2. Referring to FIGS. 2 and 2B, the movable central structure 110 is coupled to the lower portion 120i of movable frame structure 120 by the first axis torsional support members 125. The intermediate layer 182 includes the lower portions 130i of the second axis torsional support members 130, which couple the fixed frame structure 105 to the movable frame structure 120.

Lower portions 135ai-135di and lower portions 140ai-140di formed from intermediate layer 182 form both movable comb teeth and lower portions of fixed comb teeth (discussed further below with reference to FIGS. 3A and 3B) of the comb drive systems 135 and 140.

In the embodiment of FIG. 1 movable comb teeth of comb drives 35a-d extend from and are attached to the torsional support members 25. Similarly, movable comb teeth of comb drives 40a-c extend from and are attached to the torsional support members 30. In the embodiment of FIGS. 2, 2A and 2B, however, movable comb teeth of comb drives 135a-d extend away from, and are spaced from the torsional support members 125. Similarly, movable comb teeth of comb drives 140a-d extend away from, and are spaced from the torsional support members 130. Thus, in the embodiment illustrated in FIGS. 2, 2A, and 2B, the torsional support members 125 and 130 are attached at their ends, but not attached to structures along their length. Instead, a gap extends, alongside the length of the torsional support members 125 and 130, between the torsional support members 125 and 130 and the comb drives 130a-d and 140a-d respectively.

As a result, the embodiment of FIGS. 2, 2A, and 2B allows the width and length of the torsional support members to be selected independent of the comb drive geometry. This allows the torsional spring constant of the torsional support members to be more easily controlled. Further, in embodiments having paired upper and lower torsion members 130$u$ and 130$i$, it allows the width of the torsional support members to be selected so as to facilitate later removal of insulation material between the upper and lower members 130$u$ and 130$i$ if desired. Moreover, it allows the comb teeth to extend further from the torsional members to allow greater torque for the device without a concomitant increase in the length of the comb teeth. Limiting the length of the comb teeth inhibits inadvertent contact between the comb teeth that could otherwise occur as a result of excessive length and narrow spacing between the comb teeth. As such, this arrangement also allows closer spacing between adjacent comb teeth to allow greater actuation force to be generated.

Figure 3A:
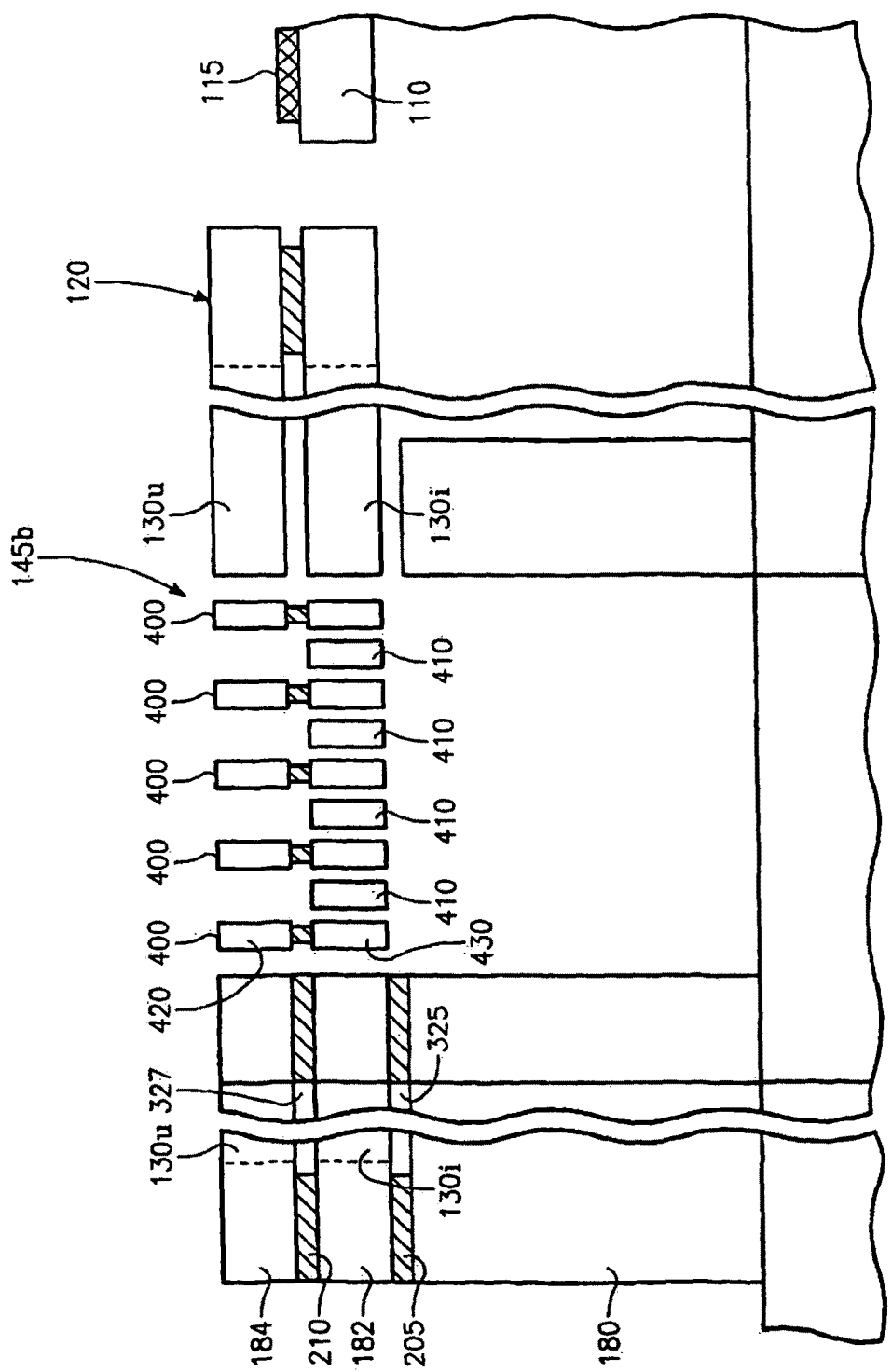
FIG. 3A is a partial cross-sectional view of the MEMS actuator shown in FIG. 2 taken through the line. A-A.

FIG. 3A is a partial cross-sectional view of the MEMS actuator shown in FIG. 2 taken through the line A-A. FIG. 3A shows a detailed view of the layered structure of the MEMS actuator 100. The layered structure includes the lower layer 180, the intermediate layer 182, and the upper layer 184. The lower layer 180 and the intermediate layer 182 are separated by a first insulator layer 205. The intermediate layer 182 and the upper layer 184 are separated by a second insulator layer 210. The movable central structure 110 is formed from the intermediate layer 182. The mirrored surface 115 is formed on the movable central structure 110.

It is possible in other embodiments to form the movable central structure 110 from the several layers. For example, it may be formed from the intermediate layer 182 and the upper layer 184 together.

Referring to FIGS. 2A, 2B and 3A, the structure of one of the second axis torsional support members 130 is shown. The second axis torsional support members 130 couple the movable frame structure 120 to the outer fixed frame structure 105. In the example embodiment of FIGS. 2-3A, the second axis torsional support members 130 have a structure that is a paired arrangement. This paired arrangement is used to provide structural support, a torsional restoring force, and routing of electrical signals. More specifically, the paired arrangement includes an upper torsional support member 130$u$ formed from the upper layer 184 and a lower torsional support member 130$i$ formed from the intermediate layer 182.

Referring to FIG. 3A, between the lower layer 180 and the lower torsional support member 130$i$ is a first gap 325 where a portion of the insulator layer 205 has been removed. Between the lower and upper torsional support members 130$i$ and 130$u$ is a second gap 327 where a portion of the second insulator layer 210 has been removed. A portion of the first insulator layer 205 and the second insulator layer 210, located between the upper and lower torsional support members 130$u$, 130$i$, remain at, or near, the fixed frame ends of the torsional support members 130.

In some embodiments, the second gap 325 located between the upper and lower torsional support members 130$u$ and 130$i$ can inhibit buckling of the torsional support members 130 that might otherwise occur if insulator material was to remain. For example, some dielectrics introduce residual stress that can cause buckling. Thus, removing some, or all, of the connective dielectric material sandwiched between the upper and lower torsional support members 130$u$ and 130$i$ can inhibit buckling.

Ideally, the gaps 325 and 327 should be wide enough to inhibit any shorting between the upper torsional support member 130$u$ and the lower torsional support member 130$i$ when they are flexing. A passivation, native oxide, or other insulator layer may be deposited in the gaps 325 and 321 to improve the electrical isolation characteristics between the upper and lower torsional support members 130$u$ and 130$i$.

The paired arrangement of the second axis torsional support members 130 serve both a mechanical and electrical function. In the mechanical context, the paired arrangement provides a means to couple the movable frame structure 120 to the fixed frame structure 105. Moreover, the paired arrangement provides a restoring torsional force that restores the movable frame structure 120 to its original position whenever it is displaced.

In the electrical context, the paired arrangement of the second axis torsional support members 130 is used to route electrical signals across the MEMS actuator 100. Specifically, in one embodiment, each of the upper torsional support members 130$u$ is a signal line. The upper torsional support member 130$u$ is used to communicate electrical potential to the comb drives 135$a$ and 135$b$, via the segment 123, while the lower torsional support member 130$i$ is a separate signal line which provides a different potential that conveniently can be selected as ground potential. Thus, the lower torsional support member 130$i$ can be conveniently used as a ground path for grounding the movable central structure 110.

In another possible embodiment, the second axis torsional support members 130 are single members. For example, the second axis torsional members may have only members made of upper layer 184 material. This embodiment only includes the upper torsional support member 130$u$ and does not include the lower torsional support member 130$i$. In such an embodiment no ground path is provided for the movable central structure 110 and the movable central structure is electrically floating.

FIG. 3A shows a partial cut away side view along the A-A line of FIG. 2. Illustrated in FIG. 3A is a cut away side view of comb drive 140$b$ from the second axis comb drive system 140. As shown in FIG. 3A, the comb drive 145$b$ includes fixed comb stacks 400 and moving combs 410. The moving combs 410, which are formed from the intermediate layer 182, are interdigitated between each of the fixed comb stacks 400. Each of the fixed comb stacks 400 includes an upper fixed comb portion 420 and a lower fixed comb portion 430. The upper fixed comb portion 420 is located directly above the lower fixed comb portion 430, and the two are coupled to each other by a portion of the second insulator layer 210. In certain embodiments, appropriate material selection and/or doping can be used to provide junction isolation between conductive layers rather than providing isolation by using insulator material, if desired.

Thus, the structural arrangement shown in FIG. 2 allows the movable central structure 110 to be moved independently around a first axis and a second axis.

II. Operational Overview

The two-axes electrostatic torsional comb-drive actuator of certain embodiments of the present invention allows a device or structure (such as a mirrored surface) mounted on the movable central structure 110 to be positioned in a wide range of positions. In certain embodiments, the actuator includes a system of comb drives located on opposite sides of torsional support members 125, 130. This comb drive system provides movement about two axes. In particular, the first axis comb drive system 125 provides movement of the movable central structure 110 around the first axis. The second axis comb drive system 140 provides movement of the movable frame structure 120 around the second axis. Moreover, the movable central structure 110 is also moved around the second axis because the movable central structure 110 is coupled to the movable frame structure 120. In this manner, the device or structure mounted on the movable central structure 110 can be accurately positioned in a wide range of positions.

The opposing comb drive arrangement also provides positive and negative rotation about an axis. Thus, using this opposing comb drive arrangement the actuator can be rotated clockwise or counterclockwise about each axis.

As shown in FIG. 3A, the actuator comb drive system includes moving combs 410 interdigitated with fixed comb stacks 400. The moving combs 410 are formed in the intermediate layer 182 and the fixed comb stacks 400 are formed in the upper layer 184 and the intermediate layer 182. The intermediate layer 182 is electrically isolated from the upper layer 184 by the second dielectric layer 210 and the gap 327.

Figure 3B:
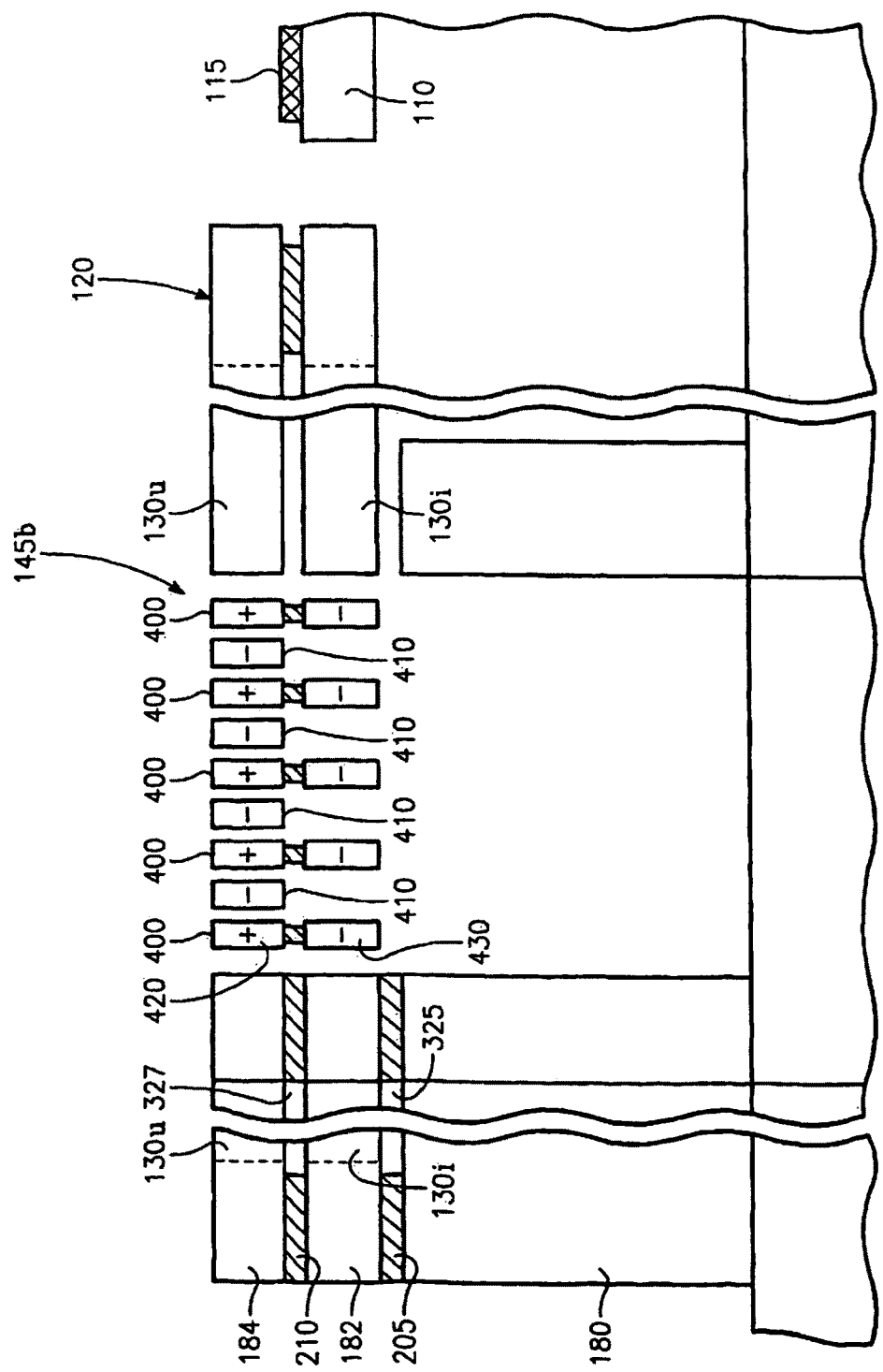
FIG. 3B is a partial cross-sectional view of the MEMS actuator shown in FIG. 2 taken through the line A-A and illustrates the movement of the comb drive.

Referring now to FIG. 3B, an electrostatic action is generated by creating an electrical potential differential between the upper fixed combs 420 of the fixed combs stack 400, the intermediate layer 182, and the moving combs 410. This may be accomplished by applying a positive voltage potential to the upper fixed combs 420 while grounding the moving combs 410. The moving combs 410 may be grounded by connecting the bond pad 198 (shown in FIG. 2) to ground. This means that the lower fixed combs 430 of the fixed comb stack 400 and the moving combs 410 are at ground.

FIG. 3B is a partial cross-sectional view of the MEMS actuator shown in FIG. 2 taken through the line A-A and illustrates the movement of the comb drive. The upper fixed combs 420 of the fixed comb stack 400 have a positive charge (as denoted by the "+" symbols in FIG. 3B). The lower fixed combs 430 of the fixed comb stack 400 and the moving combs 410 both are at ground (as denoted by the "−" symbols in FIG. 3B). The lower fixed combs 430 and the upper fixed combs 420 of the fixed comb stack 400 art electrically isolated by the second insulator layer 210 between them. However, the moving combs 410 are free to move, and they are attracted to the upper fixed combs 420 of the fixed comb stack 400. The moving combs 410 move up toward the upper fixed combs 420 thereby providing torsion about their corresponding torsional support members 130.

By way of example, when charged, a comb drive of the first axis comb drive system 135 provides movement around the first axis. Similarly, a comb drive of the second axis comb drive system 140 provides movement around the second axis when charged. Once the electrical power is removed from the upper portion of the fixed combs 420 the attraction between the upper fixed combs 420 and the moving combs 410 ceases. A restoring force is provided by torsional support members such that the moving combs 410 return to their original position, as shown in FIG. 3A.

As discussed above with reference to FIGS. 2A, 2B, and 3A certain embodiments allow independent control around the first and second axes. Thus, if movement is to be provided around the first axis the first axis comb drive system 135 can be used to provide that movement. Decoupled and independent of that movement, the second axis comb drive system 140 can be used to provide movement around the second axis.

This independent movement around each axis is achieved by electrically isolating voltage controls of the first axis comb drive system 135 and the second axis comb drive system 140 using the isolated areas. In particular, electrical power can be applied to the first axis comb drive system 135 without the second axis comb drive system 140 receiving any power, and vice versa. This independent comb drive arrangement can allows greater positioning accuracy and control.

Furthermore, as noted above, having comb drives located on either side of each axis allows electrical actuation in both positive and negative rotation about an axis. In addition, in some embodiments, it can allow positional information to be derived such as by capacitive sensing using non-driving comb drives. Moreover, it is possible in some embodiments, to use repulsive actuation potentials to increase actuation response.

The comb-drive electrostatic actuator of FIG. 2 can mitigate the problem of reduced electrostatic force due to large gaps by providing electrostatic action over much smaller gaps. Each comb drive has an array of fixed combs as one of the electrodes and an array of moving teeth as the other electrode. The comb drive is constructed such that the moving comb array is interdigitated between the fixed comb array so that the comb teeth move next to each other rather than toward or away from each other. Thus, certain embodiments can allow improved performance over the pad-type electrostatic actuator.

Further, the above process and structure allows in some embodiments a larger range of motion, it provides the ability to switch an optical signal to a greater number of possible receiving optical fibers. As such, an array of these two-axes optical switches can be employed to handle higher volumes of optical traffic.

III. MEMS Actuator Fabrication

The MEMS actuator is fabricated using a bulk micromachining process. The MEMS actuator is constructed by starting with a layered semiconductor structure. In one embodiment, the layered semiconductor structure is a silicon on insulator (SOI) structure that includes layers of silicon separated by insulator layers located over a substrate. The substrate may be a silicon wafer, or other material such as glass, sapphire, or other substrate material.

In one implementation shown in FIG. 4A, the layered semiconductor structure 600 includes a triple layer of semiconductor material 610, 620, 630. The semiconductor material is used in layers 620 and 630 is, selected for both its mechanical properties as well as its electrical properties. The semiconductor material is used to mechanically couple together the components of the MEMS actuator and to route electrical signals to the various electrical components of the MEMS actuator 100, as discussed with reference to FIGS. 2A, 28, and 3A.

The bulk micromachining fabrication process described herein also includes a self-aligned process that alleviates the registration problem discussed above that is common in vertically actuated comb-drive actuators. This self-aligned process avoids the registration problem by fabricating the comb structure together so as to provide proper alignment between the fixed comb stack and the moving combs.

FIGS. 4A-H is a possible implementation in accordance with the present invention. In general, these processes are performed on the top portion of the layered semiconductor structure and is called the frontside processing. After the frontside processing is performed a protective material process is used to protect the frontside structures before the backside is processed. The backside process is discussed in detail below.

As shown in FIG. 4A, in one implementation the frontside processing is performed using a two semiconductor layers 620 and 630, formed over a substrate 610. The two semiconductor layers 620 and 630, as well as the substrate 610, may be silicon. Thus, in one implementation, a triple-layer silicon structure 600 is formed having a substrate 610, an intermediate semiconductor layer 620, and an upper semiconductor layer 630. A first insulator layer 640 is located between the substrate 610 and the intermediate layer 620. Similarly, insulator layer 650 is located between the intermediate layer 620 and the upper semiconductor layer 630.

Figure 4B:
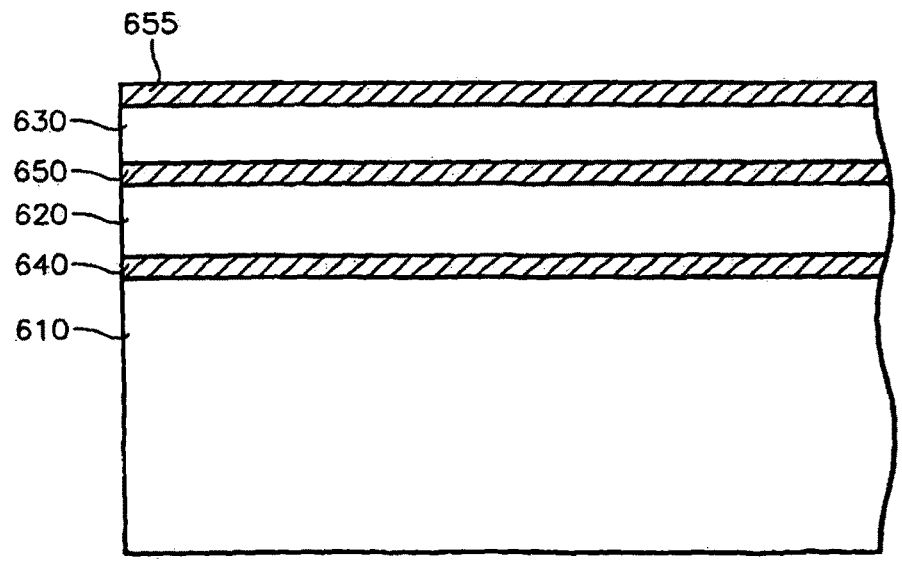
Figure 4C:
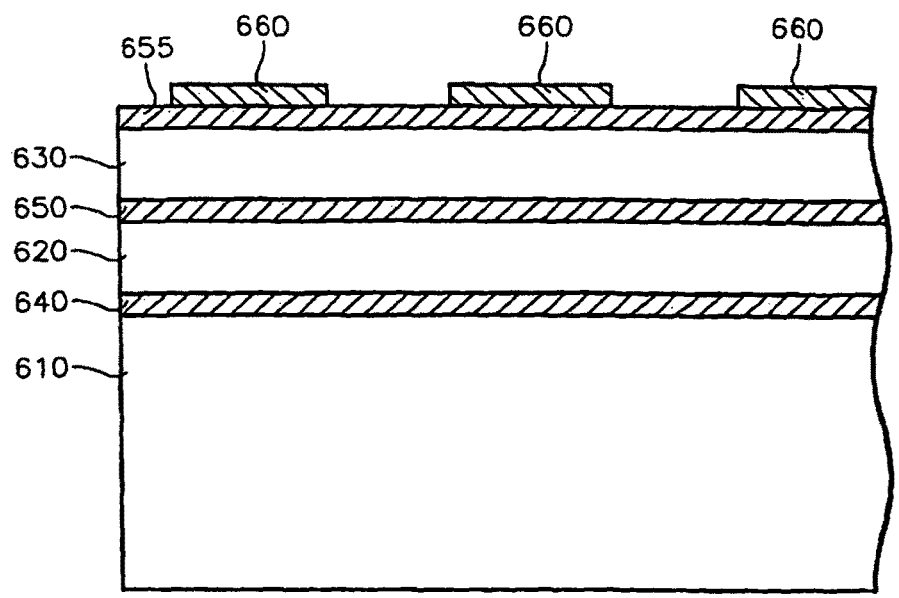
Figure 4D:
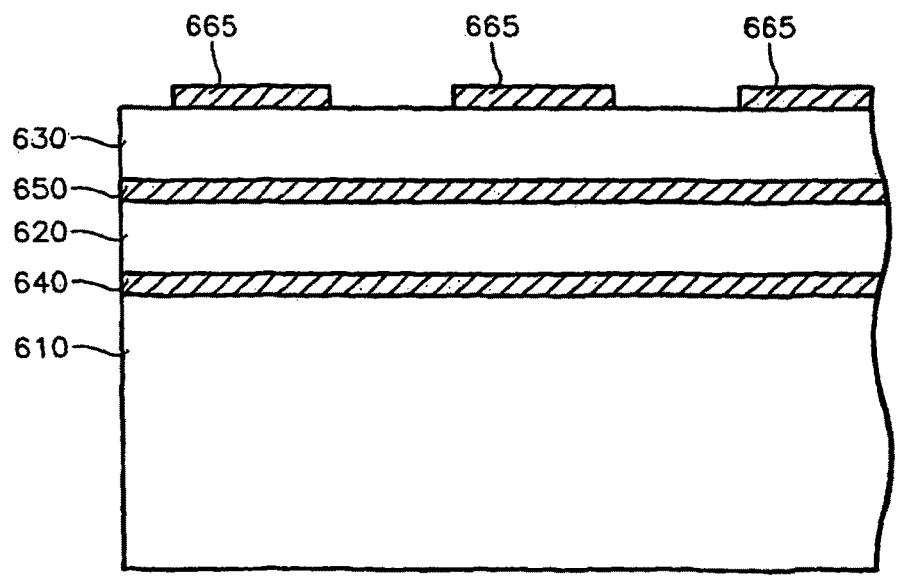

As shown in FIG. 4B, a layer 655 is applied to the triple-layer semiconductor structure 600. Layer 655 is used to form a hardmask for etching the comb structure, as well as other structures of the MEMS actuator 100. As such, layer 655 may be oxide, or other suitable hardmask material. After depositing the hardmask material layer 655, the hardmask material layer 655 is patterned using resist, as shown in FIG. 4C. The hardmask material layer 655 is patterned with overwidth fixed comb photoresist masks 660. The overwidth photoresist mask 660 patterns the hardmask material layer 655 wider than the eventual width of the fixed comb teeth. The overwidth photoresist mask 660 is used to etch the hardmask material layer 655 to form overwidth hardmask portions 665 as shown in FIG. 4D. Thereafter, the overwidth photoresist mask is stripped as shown in FIG. 4D.

Figure 4E:
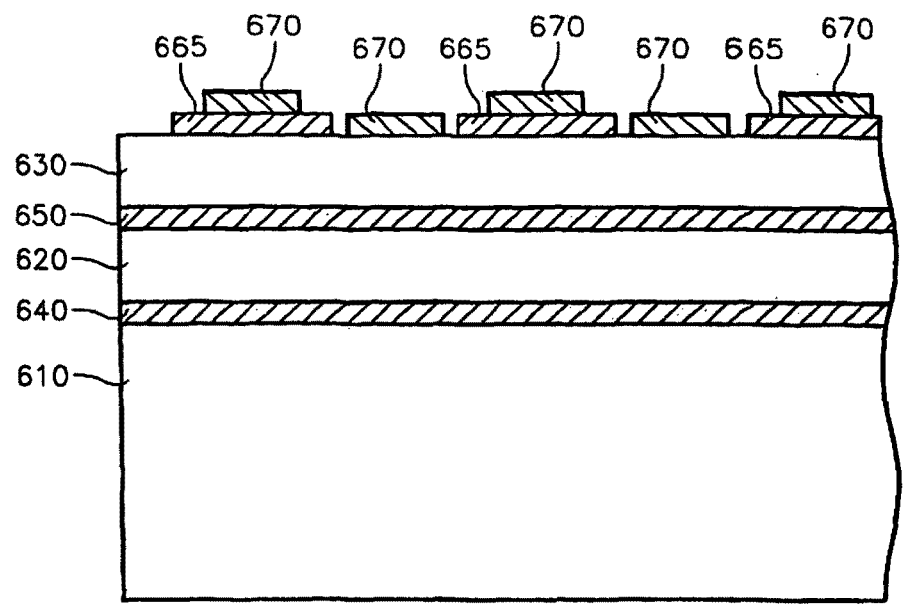

Turning to FIG. 4E, a second photoresist pattern 670 is used to define the location and width of the fixed and movable comb teeth. The photoresist pattern 670 is formed on the overwidth hardmask portions 665, and on portions of the upper silicon layer 630 between the hardmask portions 665. The overwidth hardmask portions 665 shown in FIG. 4D mitigate misregistration in placement of the resist 670 on the overwidth hardmask portions, while the distance between the fixed and moving comb teeth is set by the mask 670, regardless of mask misregistration.

Figure 4F:
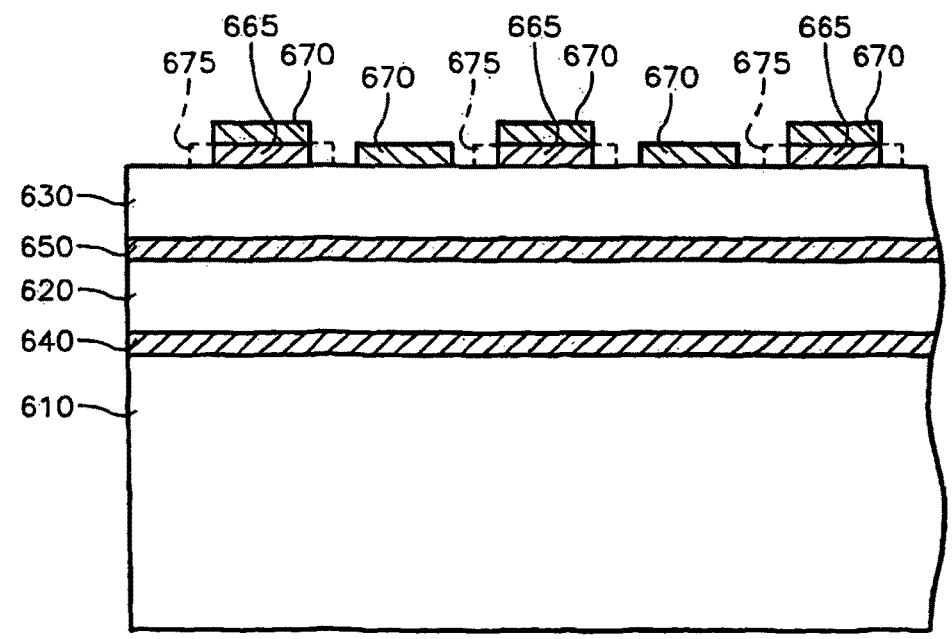

As shown in FIG. 4F, after the patterning the comb structure with the resist mask 670, the overwidth hardmask portions 665 are etched using the mask 670 to remove excess hardmask material 675. In FIG. 4F, this excess hardmask material 675 is shown in phantom.

Figure 4G:
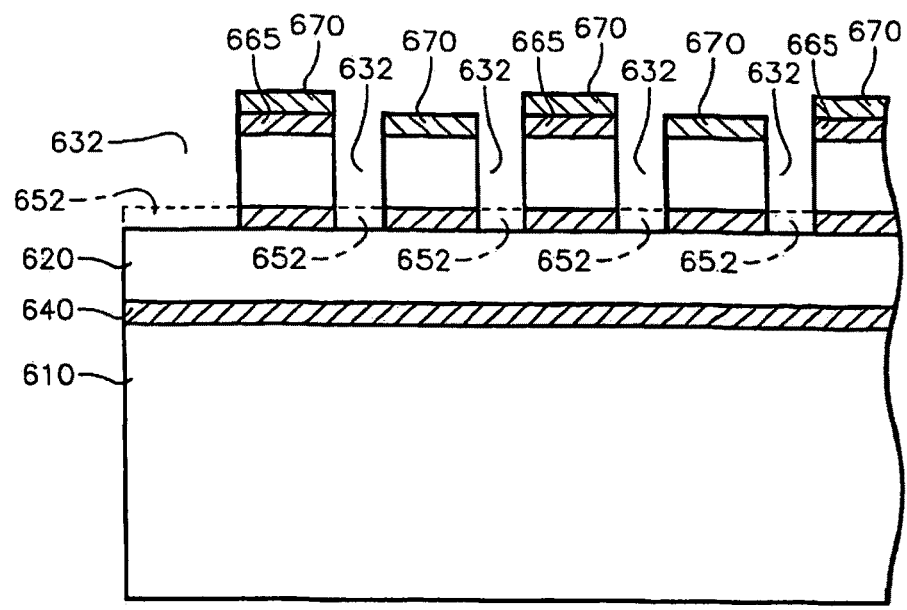

Turning to FIG. 4G, after the excess portions 675 of hardmask are removed the comb teeth can be defined in the semiconductor layers below using the resist pattern 670. As shown in FIG. 4G, unmasked portions of the upper semiconductor layer 630 are removed to forth the gaps 632 between and adjacent the comb teeth. A deep trench reactive ion etch may be utilized to ensure well defined etch profiles with the hardmask layer 650 acting as an etch stop material for the silicon etch process.

After removing forming gaps 632, the exposed portions 652 of second insulator layer 650 are removed using the resist pattern 670.

Figure 4H:
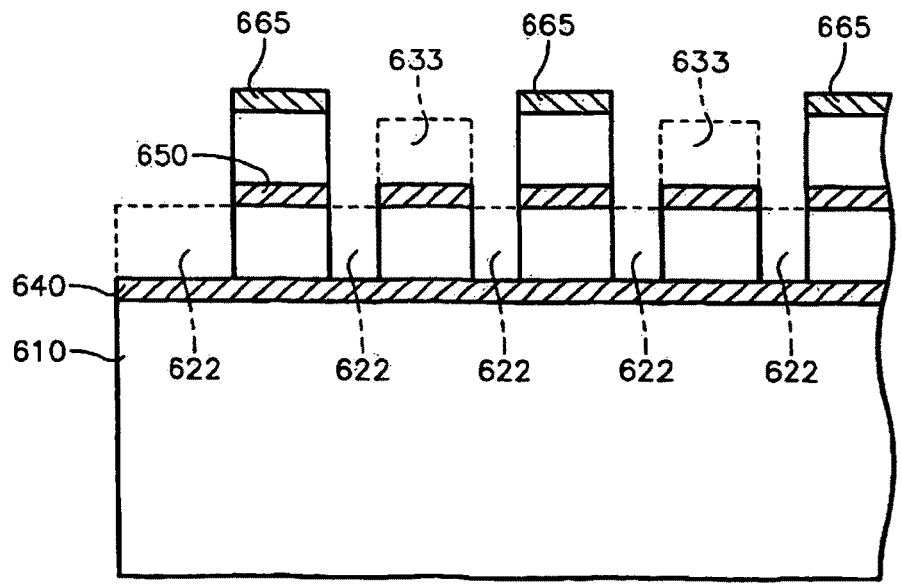

Turning to FIG. 4H, after the removal of second insulator portions 652, the resist pattern 670 is stripped. An etch is performed to etch portions 622. Also removed with this etch are the exposed semiconductor portions 633. Typically, the semiconductor layers 620 and 630 will have the same thickness so the semiconductor portions 633 and 622 will complete etching at approximately the same time. Nevertheless, the insulator material below 633 and 622 can be selected to provide an etch stop after removal of portions 633 and 622. The first insulator layer 640 acts as an etch stop that allows deeper etching and higher aspect ratio etching. A high aspect ratio etch such as a deep trench plasma etch or similar high aspect ratio etch may be utilized to ensure well defined etch profiles of the semiconductor material. This allows the height, width, length, and spacing of the comb teeth to be selected to provide a wide range of movement and/or better response times. For example, very tall, narrow, long, and closely spaced combs are possible to allow a wider range of positioning of an actuator.

The processing procedures utilized in FIGS. 4A-4H to define the comb drives 135 and 140 of FIGS. 1, 2A and 2B, also can be employed during comb drive fabrication to define the other silicon and insulator structures of the MEMS actuator 100 discussed above with reference to FIGS. 2A and 2B.

Although in the comb drive actuator embodiment of in FIGS. 2A-3B, the taller stacked comb teeth are the fixed comb stacks 400 and the shorter comb teeth are the moving combs 410, it is possible in other embodiments to reverse this arrangement and provide the shorter comb teeth as fixed comb teeth and the taller comb teeth as moving comb teeth.

After the comb structure has been defined as illustrated in FIGS. 4A-H, the exposed semiconductor surface may be passivated (not shown). Also, after defining the comb structure and other structures, the mirror or other device is formed on the central movable structure. For example, a composite Ti/Pt/Au mirror may be formed on the central movable structure. Furthermore, as discussed further below, a back side etch may be performed to remove portions of substrate material 610 and portions first insulator layer 640 under the combs.

In this implementation of FIGS. 4A-4H, the comb structure remains and is self-aligned because of the pattern created using the top insulator layer 655 and the resist 670. Because the same pattern is used to define the fixed comb stacks and the moving combs, the registration problem is eliminated. The width and spacing of the entire height of the fixed comb stacks and the moving combs are defined using a single photoresist mask.

In the implementation of FIGS. 4A-4H, the combs are not subject to residual stress due to multi-step comb material deposited layers that can cause some of the combs to be physically skewed to one side or another. When this occurs, the comb will be attracted to one side more that the other, causing instability. By way of example, if the fixed combs were etched in a prior step and then the moving combs were etched later, residual stress could cause the moving combs to be skewed to one side. This means that a moving comb located between two fixed combs would be closer to one fixed comb that the other. When an electrostatic force was applied, the skewed moving comb would be located to the closer fixed comb more than the other fixed comb, thereby causing instability. This registration problem is an inherent problem with conventional vertically actuated comb-drive actuators.

Fabrication of the fixed comb stacks and the moving combs are created with the above self-aligned process avoids the problems otherwise associated with conventional fixed and moving combs fabrication. This decreases the probability that damage to the combs will occur during fabrication or during operation and thus increases yield and reliability.

Figure 5A:
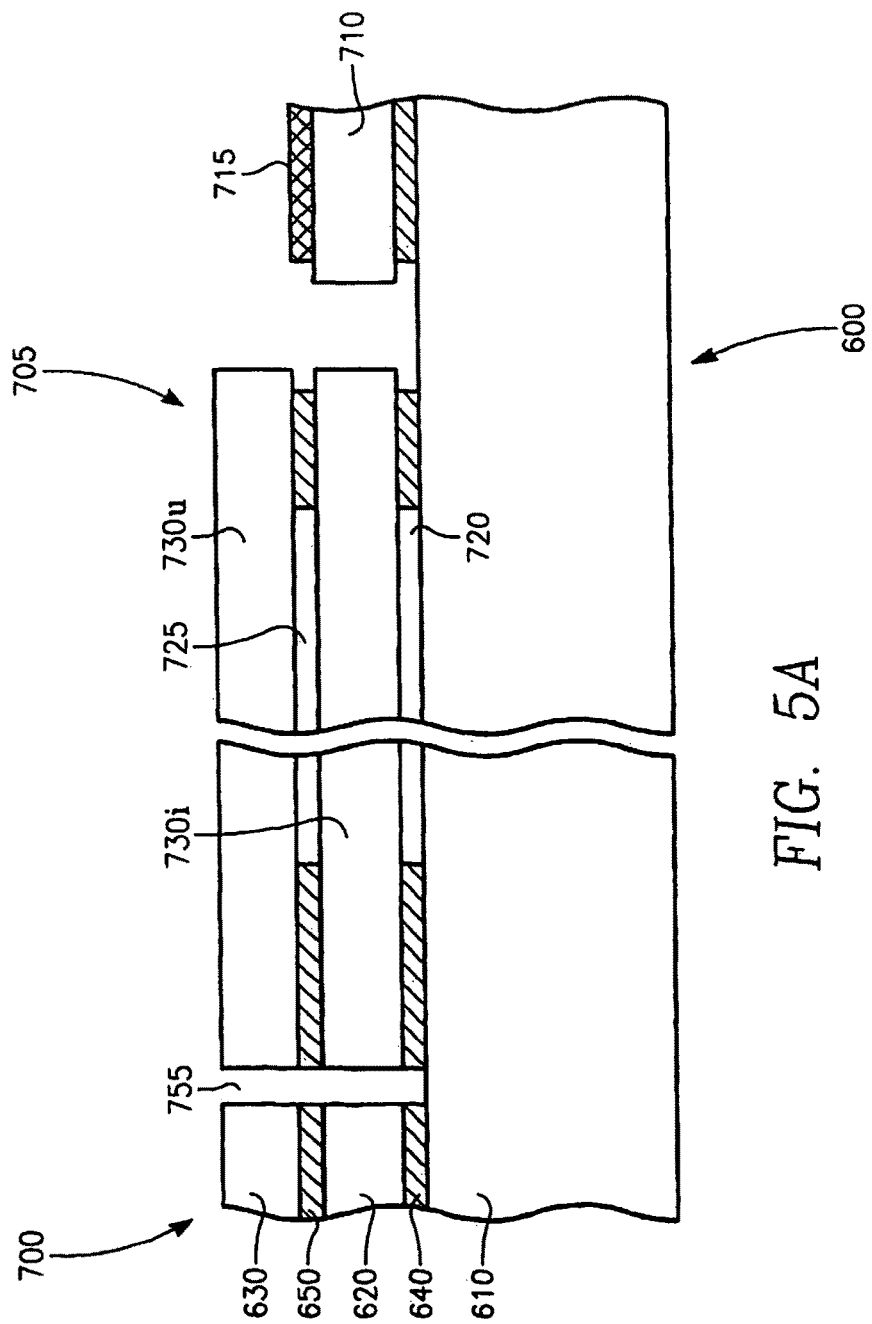
FIG. 5A-G illustrate a possible implementation of the bulk protective material process for the self-dicing process in accordance with the present invention.

FIG. 5A illustrates a cross section of portions of two MEMS devices 700 and 705. FIG. 5A shows a mirrored surface 715 is located on top of the bottom semiconductor layer 620. A first gap 720 between the substrate layer 610 and the intermediate semiconductor layer 620 may be formed during the frontside processing discussed above reference to FIGS. 4A-4H. This can be accomplished allowing the etch of the first insulator layer 640 to undercut the intermediate semiconductor layer 620. A second gap 725 also was created between the intermediate semiconductor layer 620 and the upper semiconductor layer 630 by removing a portion of the second insulator layer 650 therebetween. Similarly, this can be accomplished allowing the etch of the second insulator layer 640, discussed above, to undercut the intermediate semiconductor layer 620.

Although not shown in FIGS. 5A-5H, a passivation layer, such as an oxide layer (not shown) typically is formed on the front side exposed semiconductor surfaces during front side processing.

The gap 725 is created to inhibit buckling of between the torsional support members 730i and 730u during torsion. If there is any oxide left between the torsional support members buckling possibly could occur in certain embodiments. If the torsional support members buckle the combs are no longer self-aligned and become skewed. Thus, in some embodiments, the gap 725 between the torsional support members 730i and 730u inhibits buckling to improve robustness of the actuator 100.

In certain implementations, a backside process is used. The backside process can include providing a cavity behind moving structures of MEMS devices 700 and 705 such as the central movable structure 710 and the comb drives (not shown in this cross-section) to allow their movement. Furthermore, as will be discussed further below, and in U.S. patent application Ser. No. 10/020,050, filed Dec. 13, 2001, by Wang et al., entitled LOW DEFECT METHOD FOR DIE SINGULATION AND FOR STRUCTURAL SUPPORT FOR HANDLING THIN FILM DEVICES, issued as U.S. Pat. No. 6,573,156, on Jun. 30, 2003, herein incorporated by reference in its entirety, self dicing of MEMS devices can be accomplished. As illustrated, it may be accomplished by providing a cut or groove 755 between the first MEMS device 700 and the second MEMS device 705 during front side processing in conjunction with backside processes.

Figure 5B:
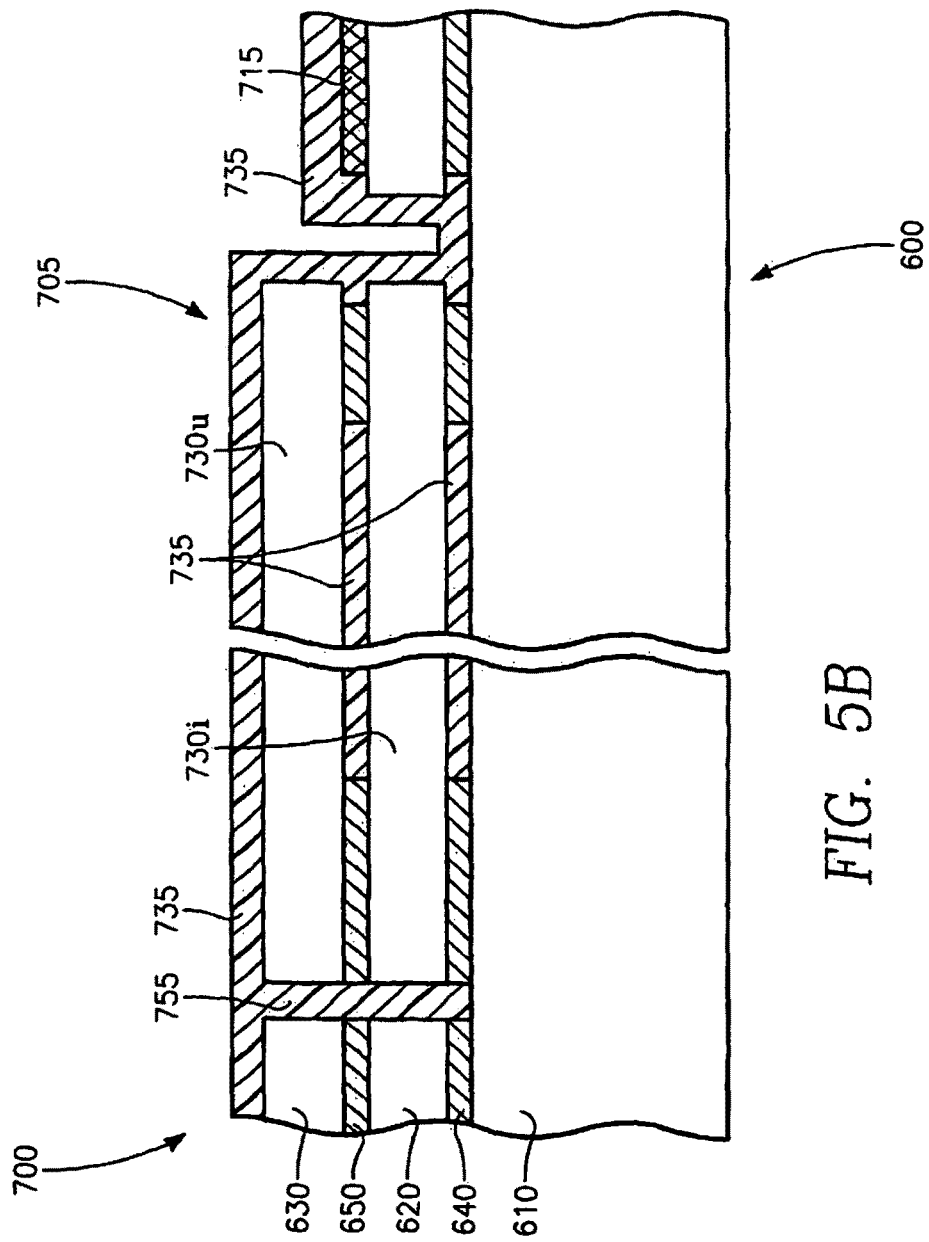

As shown in FIG. 5B, a protective material 735 is applied to the front side structures prior to backside processing. The protective material 735 may be a conformal material which deposits into the gaps between and around the structures of the MEMS devices 700 and 705 (including the comb drives, the torsional support members, and gaps between devices). In part, the protective material 735 protects the structures and surfaces of the MEMS devices 700 and 705 during backside processing.

Any type of protective material may be used in this process, such as, for example photoresist. With smaller geometries, however, pockets of air can inhibit photoresist completely surrounding the structures. Thus, photoresist does not always work well on smaller geometries because the photoresist cannot reach each cavity of the MEMS devices 700, 705. Epoxy may also be used as the protective material, but epoxies can sometimes present problems with completely filling small cavities.

In certain implementations the protective material is selected so as to allow dry or vapor phase deposition, and dry phase removal of the protective material. This can help avoid surface tension effects and solvents which could otherwise contribute to formation of voids or cause stresses on the structures.

In one implementation, the protective material is parylene. Parylene is an extremely conformal material. Parylene may be deposited from vapor phase into cracks and crevices of the MEMS structure and leaves substantially no voids at the depositing surface.

Figure 5C:
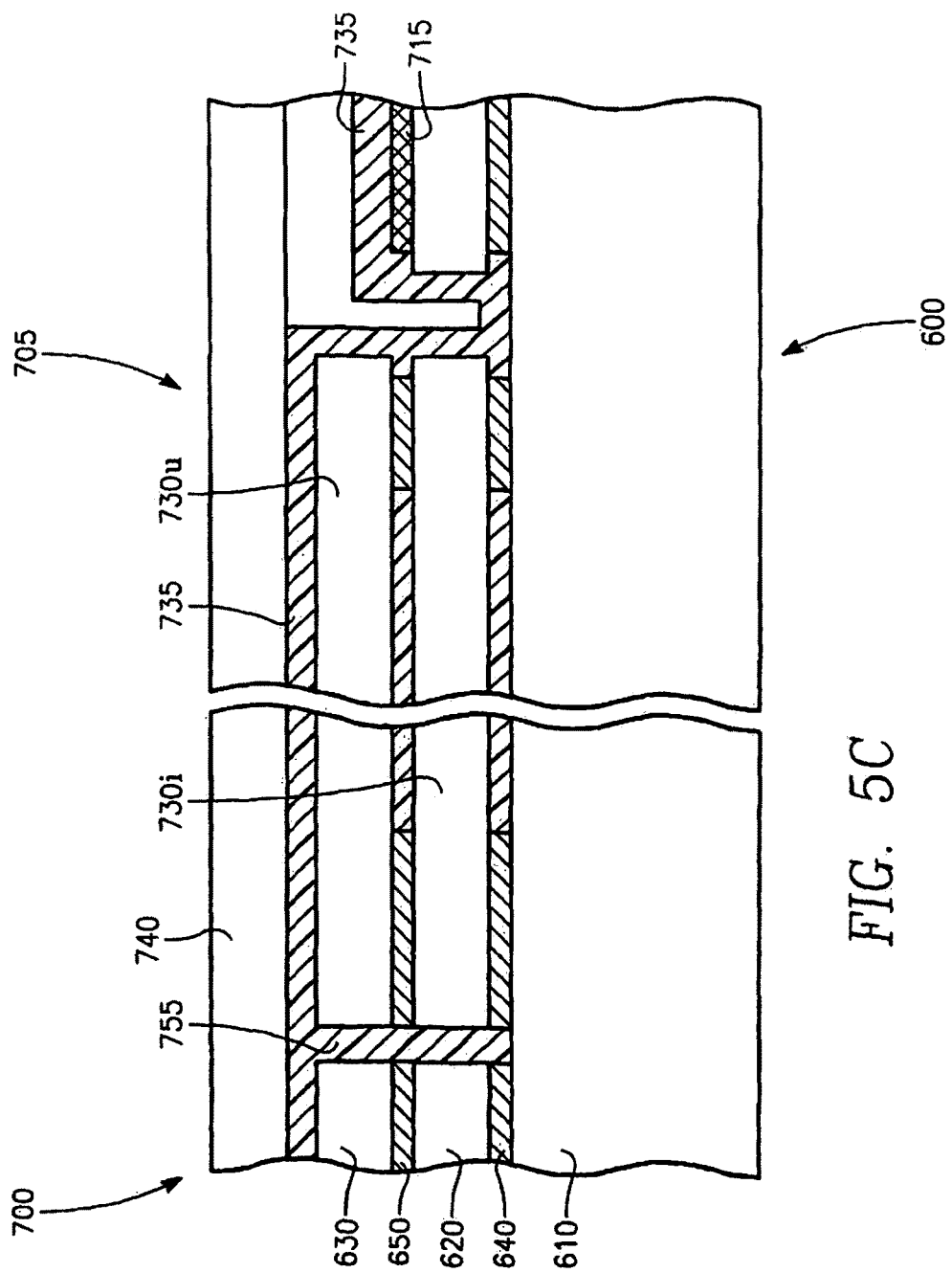

As shown in FIG. 5C, in certain implementations, after the protective material 735 has been applied, an optional carrier wafer 740 is attached to the front side of the triple-layer semiconductor structure 600. The carrier wafer 740 may be applied with a bonding agent, such as resist. The carrier wafer 740 facilitates handling of the triple-layer semiconductor structure 600 for processing. While the triple-layer semiconductor structure 600 is inverted for backside processing, the protective material 735 serves to hold pieces of the MEMS devices 700, 705 together and also provides protection to any exposed parts.

Figure 5D:
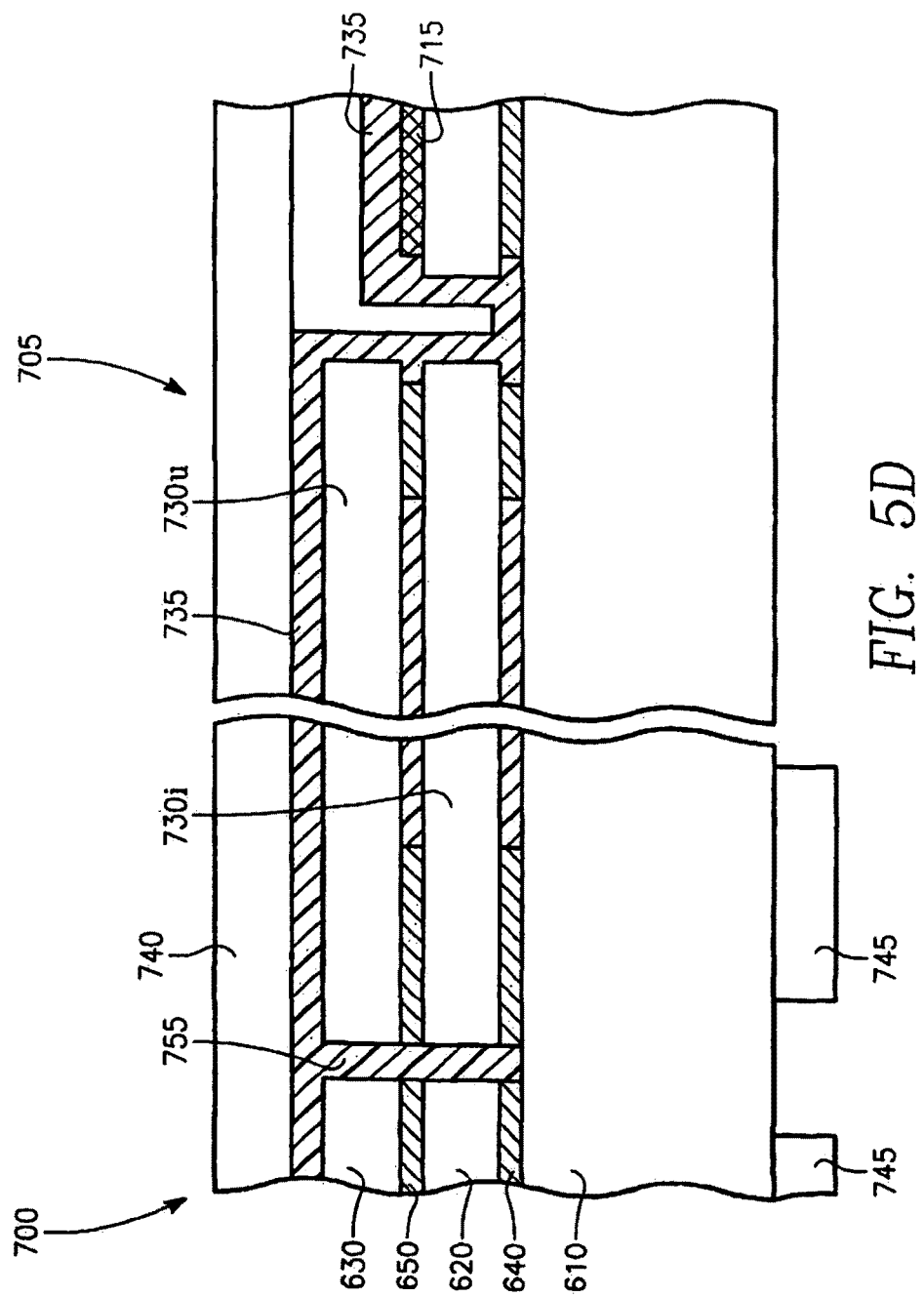
Figure 5E:
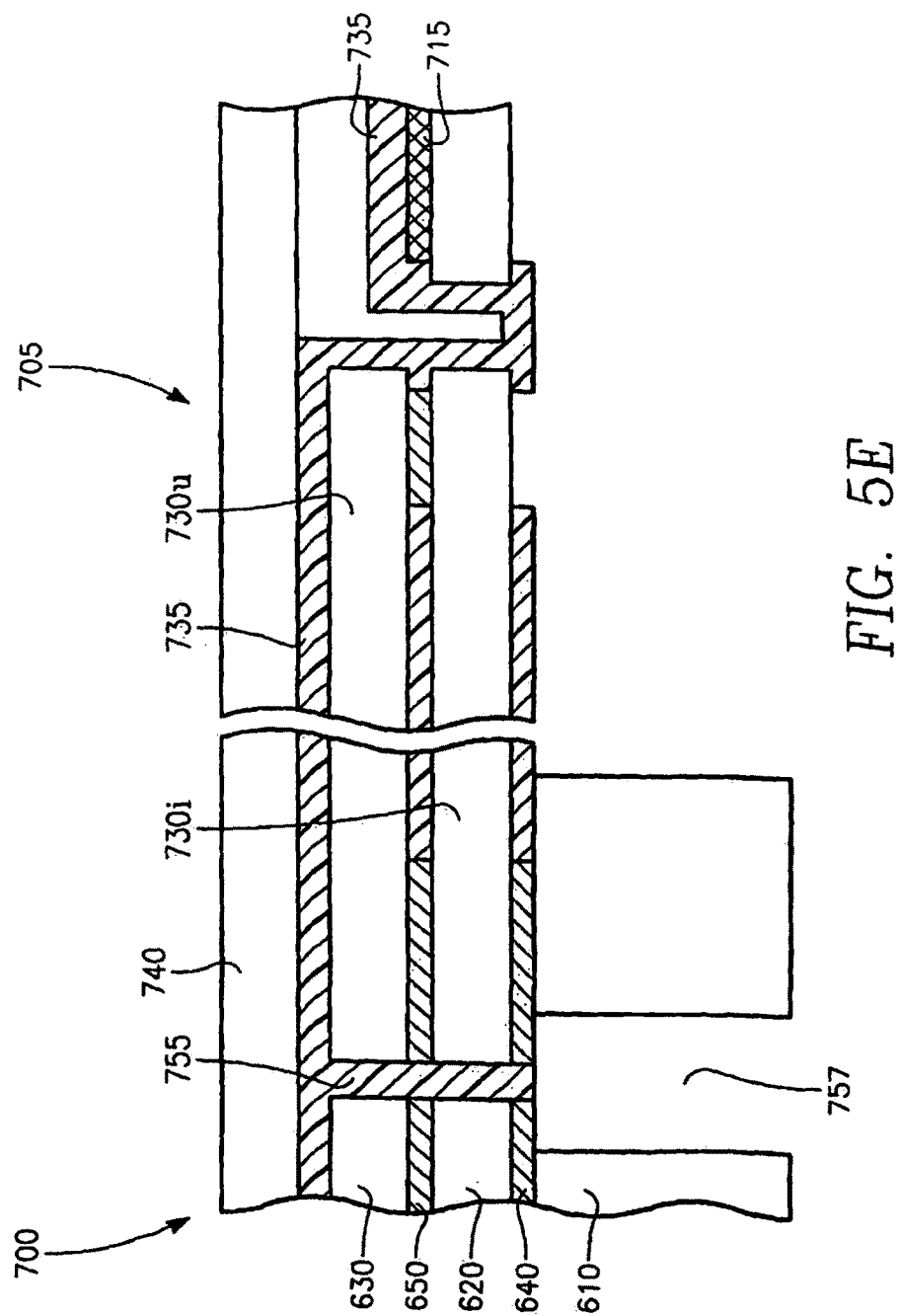

The triple-layer semiconductor structure 600 then is patterned with resist 745 placed on the substrate semiconductor layer 610, as shown in FIG. 5D. Next, as shown in FIG. 5E, the substrate layer 610 is patterned and etched to remove portions of the substrate layer 610 under movable structures, such as the central movable structure, or the comb drives (not shown) of the MEMS device. Thereafter, the resist 745 and the exposed portions of the first insulator layer 640 are removed.

FIG. 5E also shows that the groove 755 etched between the first MEMS device 700 and the second MEMS device 705 is now joined to groove 757 etched from the backside of the substrate 610. Thus, after processing the grooves 755 and 757 completely separate the first MEMS device 700 and the second MEMS device 705, which are held together only by the protective material 735 and the carrier wafer 740. As the parylene is removed, the MEMS devices separate, already diced and separated. This self-dicing process can prevent damage and debris contamination that can be caused by traditional mechanical dicing tools.

Referring to FIG. 5E, although not shown, in some implementations, it is possible to fabricate a mirror or other device on the back side 710b of the central movable structure 710 instead of, or in addition to the mirror 715 shown on the front side. Further, in other implementations not shown in FIG. 5E, it is possible to etch a portion of the movable central structure 710 to reduce its mass. For example, a portion of the back side surface 710b may be etched to hollow out the movable central structure 710. Reducing the mass of the movable central structure 710 can improve actuation response. Further in some implementations, the movable central structure 710 may be provided with a honeycomb, channeled, crosshatched, or other pattern to reduce mass while providing structural strength.

Figure 5F:
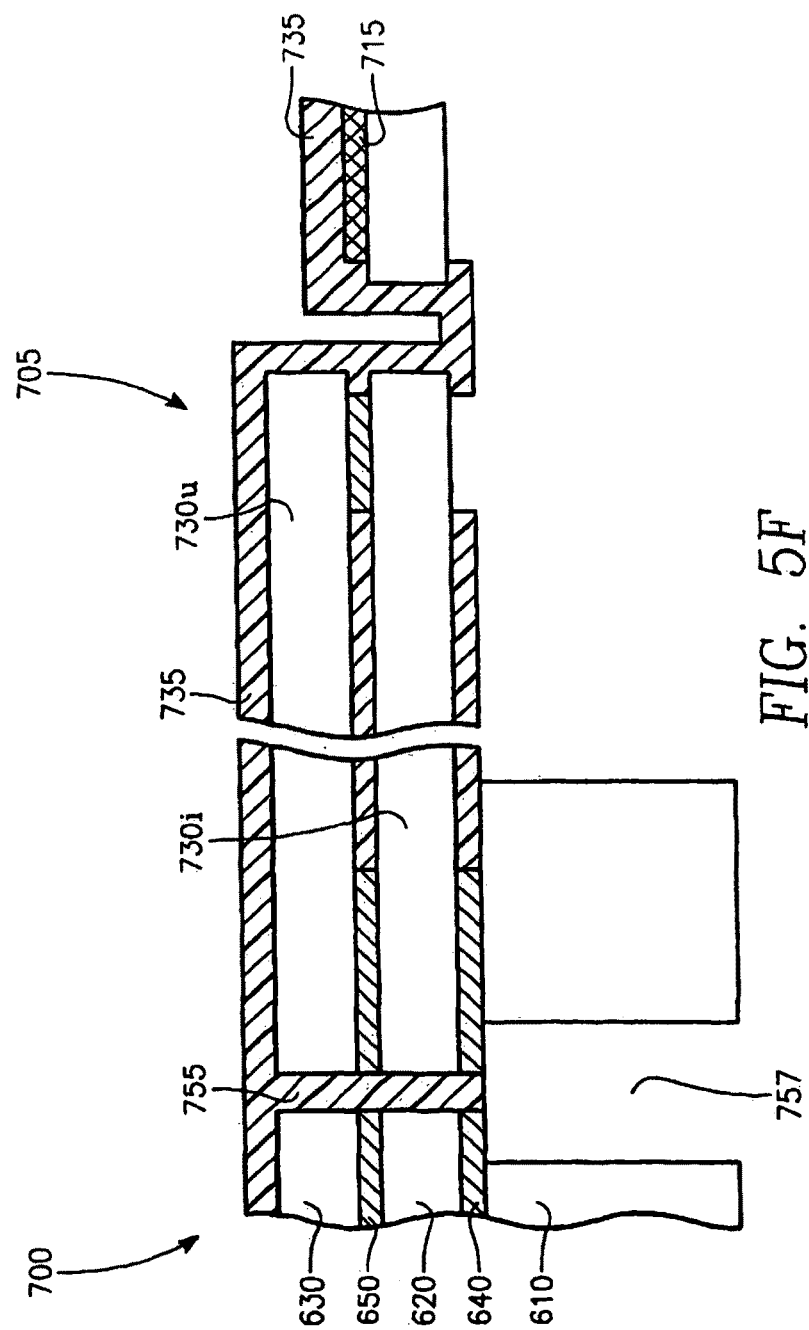
Figure 5G:
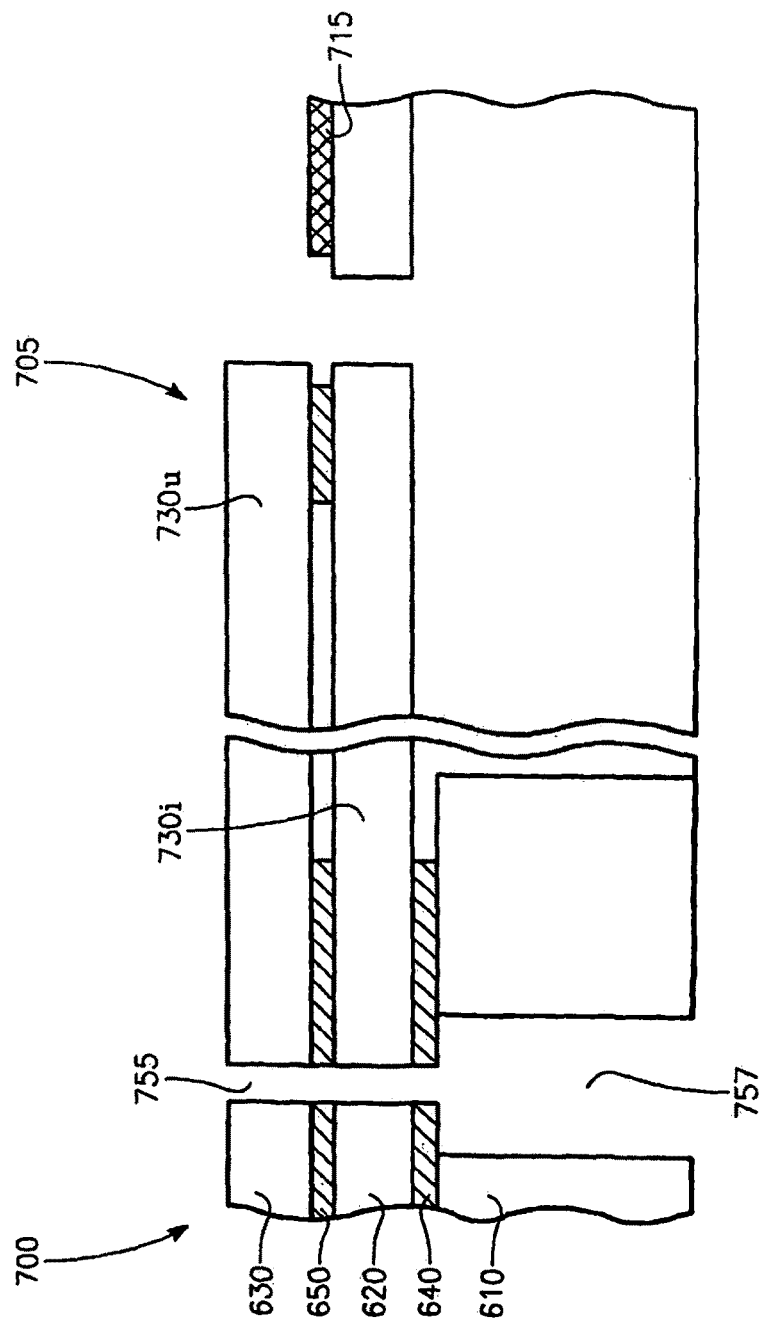

As shown in FIG. 5F, the carrier wafer 740 then is removed. Next, as shown in FIG. 5G the protective material 735 then is removed from the entire structure. In the case of parylene, an oxygen plasma asher, or other suitable apparatus may can be used to remove the parylene. Dry removal of the protective material 735 helps minimize damage to fragile structures, which could otherwise result from wet removal processes. Further, a dry removal process can limit contamination that otherwise might be associated with wet removal processes. Removing the parylene dices MEM devices without requiring sawing, scoring, cutting, grinding, or other similar separation techniques.

Second Preferred Comb Drive Micromachining Process

Described below with reference to FIGS. 6A-6M are detailed instructions used for fabricating two-axes MEMS comb drive structures for high-speed optical switches. This process utilizes a few additional features beyond those described with reference to FIGS. 4A-4H. Included in this process are alignment marks 826, shown in FIG. 6C, for a step-and-repeat lithography tool, aluminum wire-bond pads 832A and 832B, shown in FIG. 6B, for making reliable, robust electrical contacts to both layers of the MEMS mirror structures, and vent holes 806, shown in FIG. 6J, to control the release of entrapped gas from the backside-etched cavity 808 during the release etch of FIG. 6J.

Figure 6A:
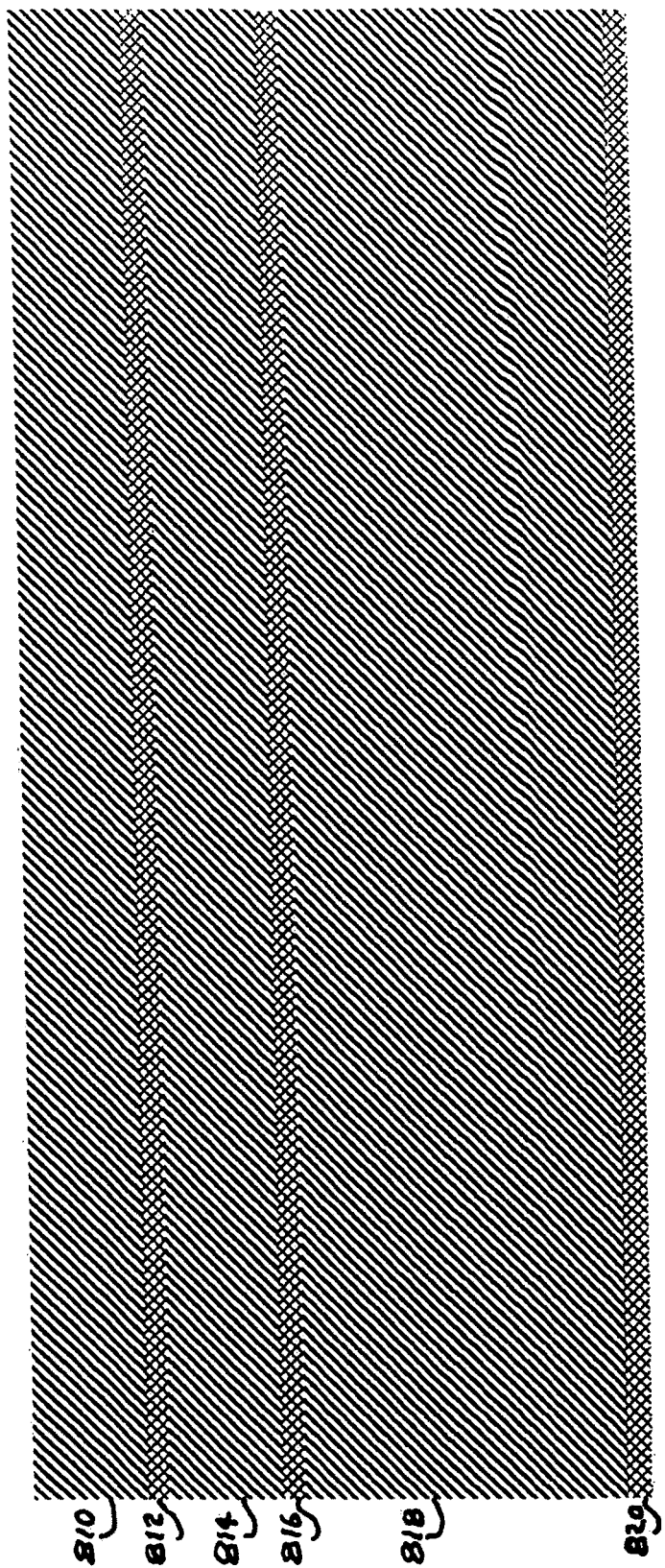

As shown in FIG. 6A, a triple-layer p-type single crystal silicon semiconductor structure 800 with two buried silicon dioxide layers, similar to structure 600 shown in FIG. 4A, is used. In this embodiment, layer 810 is 25 microns thick, layer 812 is 1.5 microns thick, layer 814 is 25 microns thick, layer 816 is 1 micron thick, layer 818 is 380 microns thick, and layer 820 is 1 micron thick. Layers 810, 814, and 818 are made from p-type single-crystal silicon. Layers 812, 816, and 820 are thermally-grown silicon dioxide.

Figure 6B:
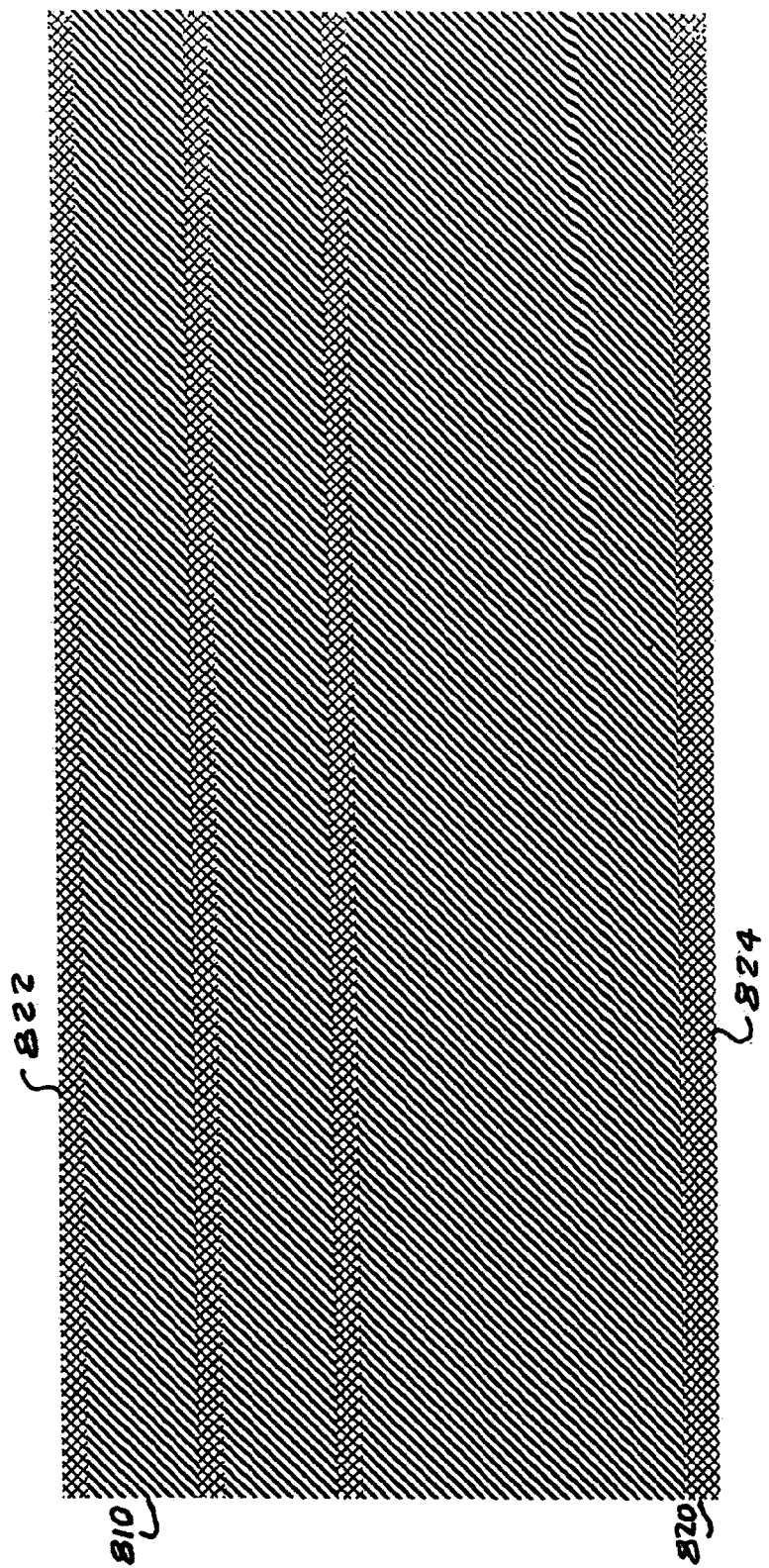
Figure 6C:
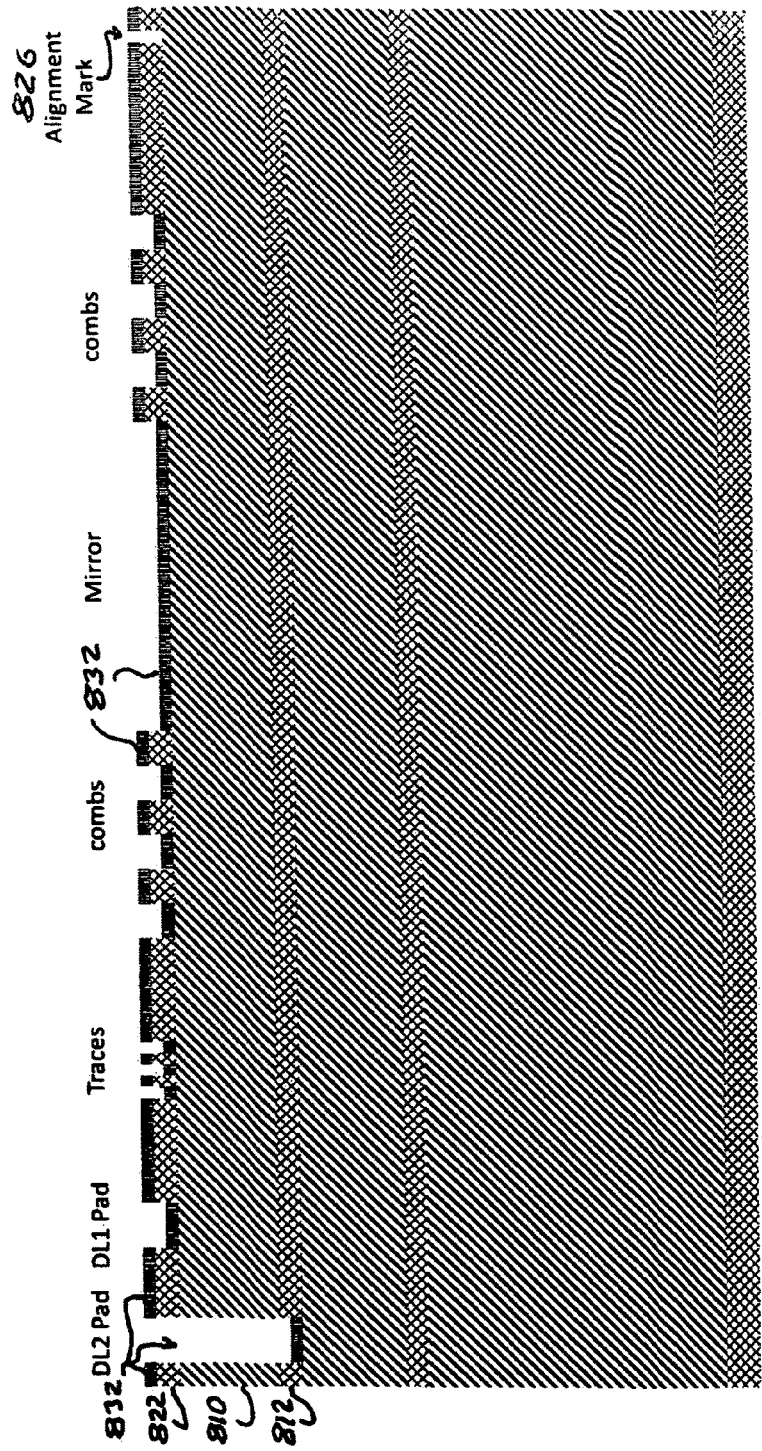
Figure 6E:
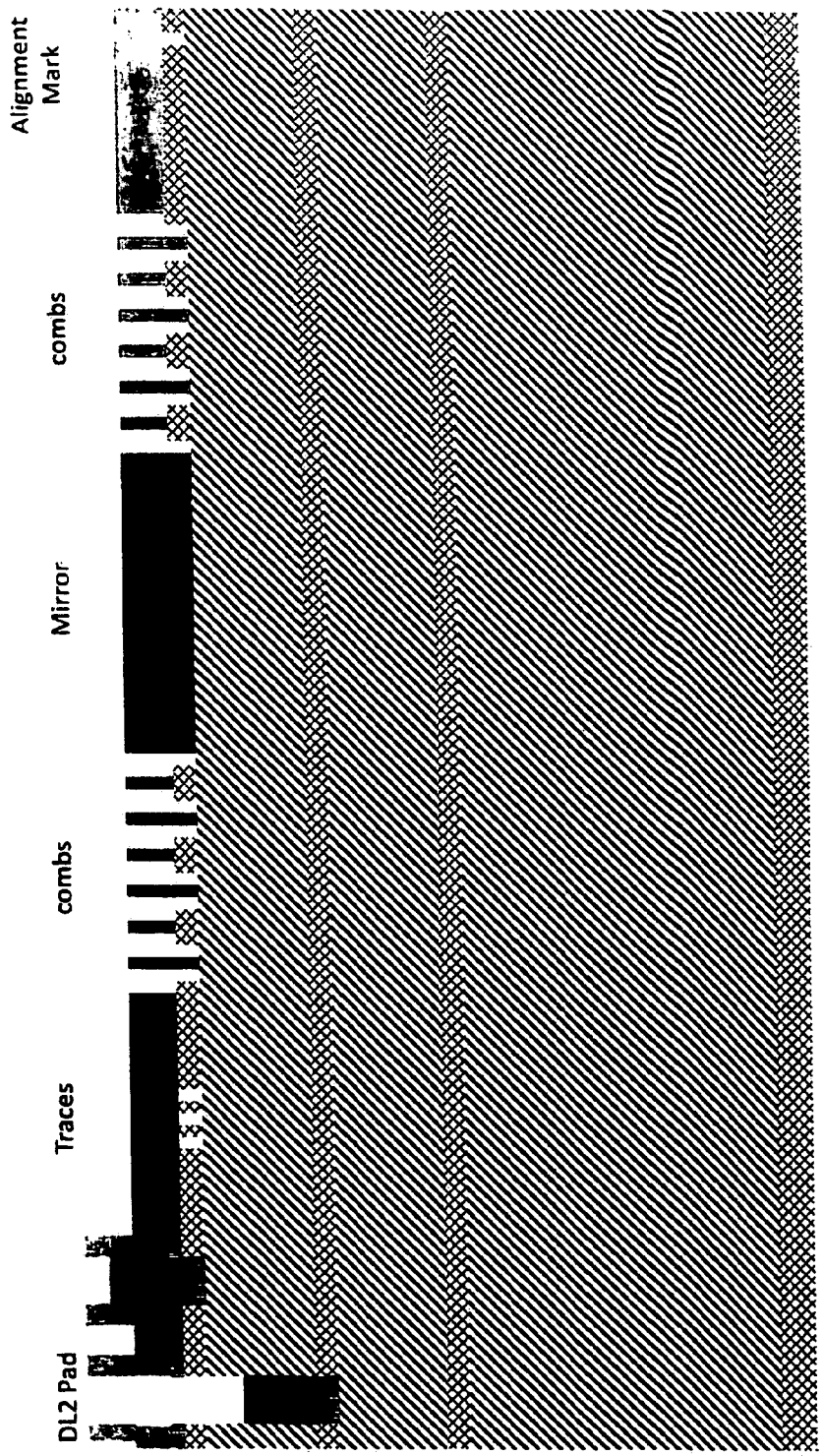

FIG. 6B shows the initial oxidation step applied to the substrate. Sufficient heat and time is used to grow 1.5 microns of silicon dioxide to a bare silicon surface 822. Some additional silicon dioxide is grown on the backside of the wafer, contributing to the thickness of 824. FIG. 6C shows the initial patterning sequence applied to the wafer. First, alignment marks 826 are etched into the silicon dioxide layer. These are used for alignment of a step-and-repeat projection lithography tool. Next, the silicon dioxide layer 822 is patterned with various features 828 in a similar manner as in FIG. 4D. Then, openings through the silicon dioxide layer 822, the silicon layer 810, and the first buried oxide layer 812 are created using lithographic patterning and various reactive ion etch tools. These openings provide electrical access to the second silicon layer 814 and will serve as the location for wirebonding pads 830. Finally, the photoresist layer used as a lithographic mask is removed, the wafer is cleaned, and entire top surface of the wafer is coated with 1.5 microns of aluminum 832 using a metal sputtering tool. FIG. 6D shows how to pattern the aluminum layer 832. 7 microns of negative photoresist is applied to the top surface of the wafer. This photoresist is lithographically patterned such that the wire-bonding pads 832A and 832B remain covered, while all other areas are left exposed. FIG. 6E shows the removal of the aluminum through wet etching. This wet etch step isotropically removes aluminum everywhere from the wafer except for the regions that remain protected by the photoresist applied and patterned as shown in FIG. 6D. Leaving the negative photoresist in-place, a layer of 6 micron-thick positive photoresist is applied to the top surface of the wafer and patterned. This photoresist performs the same function as the masking layer applied in FIG. 4E.

Figure 6F:
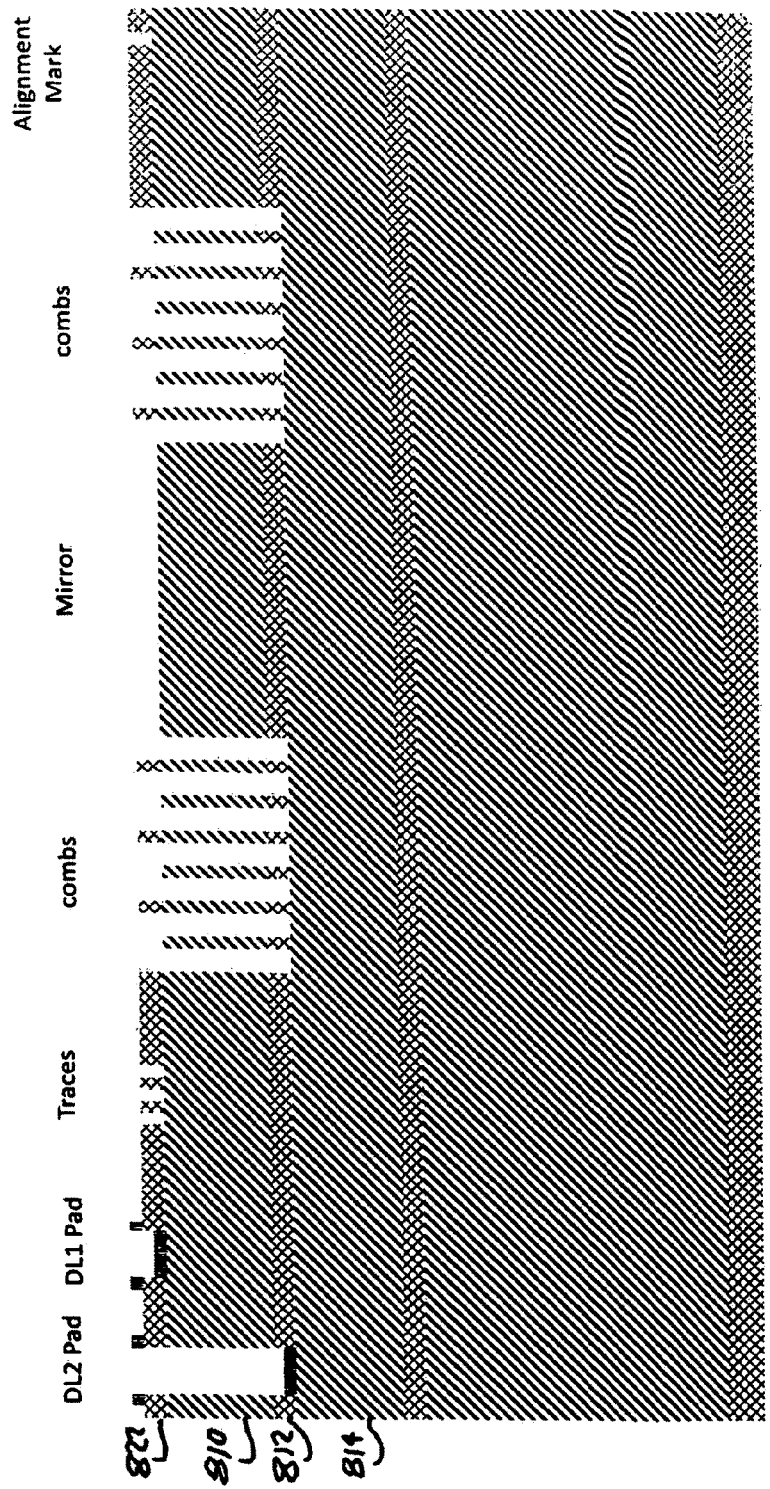
Figure 6I:
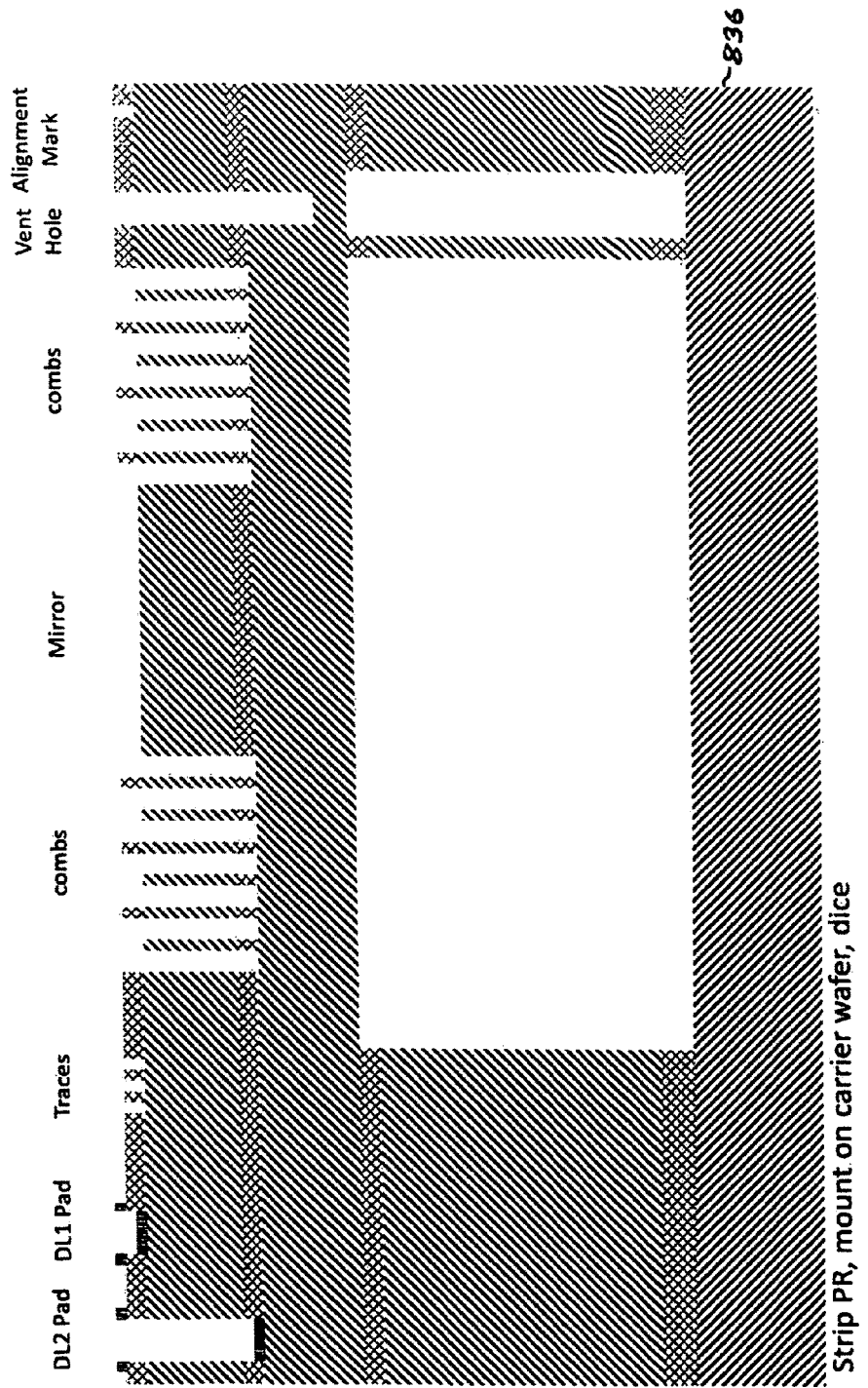
Figure 6J:
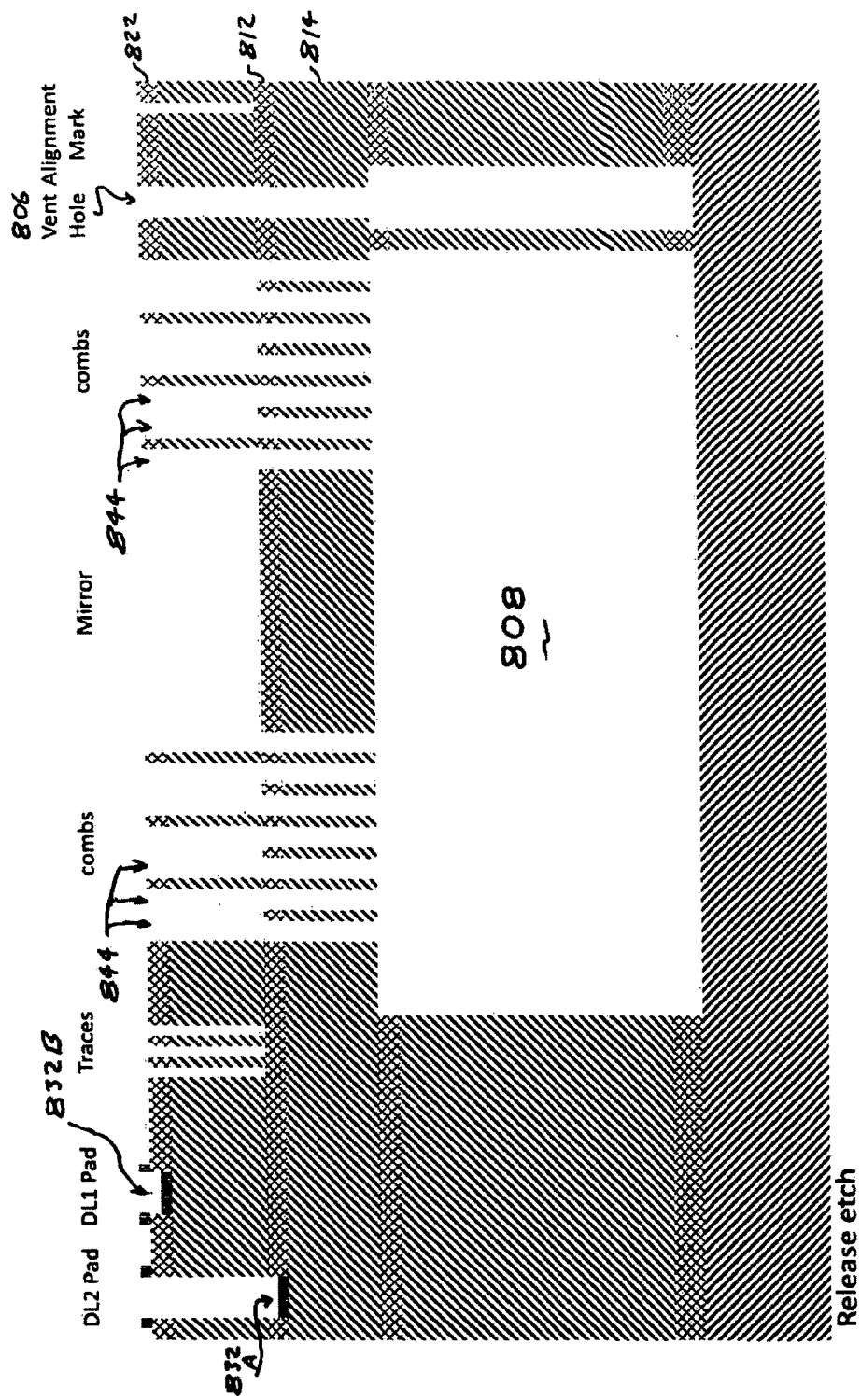
Figure 79:
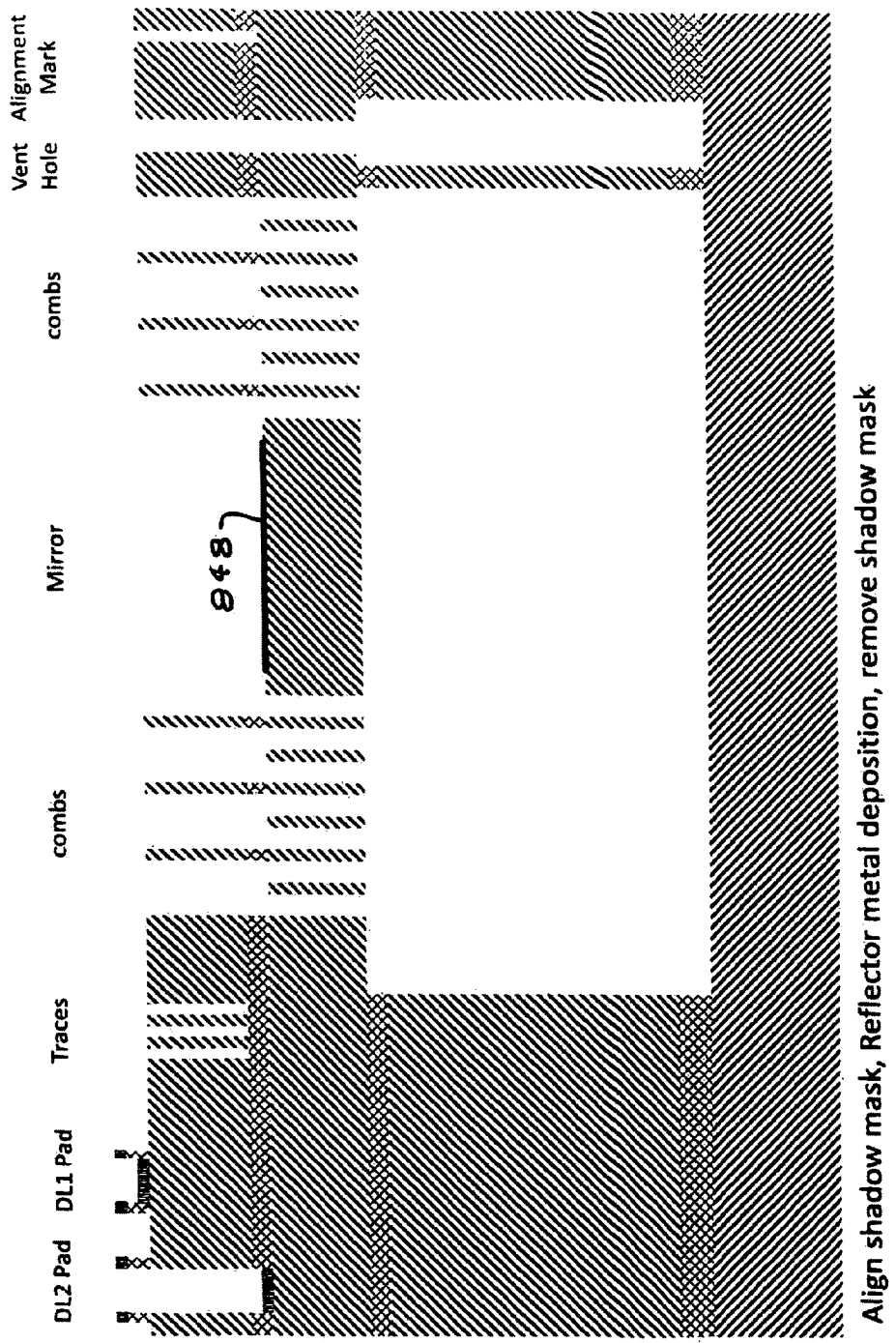

In FIG. 6F, the silicon dioxide layer 822 is patterned using reactive ion etching, followed by deep reactive ion etching of the silicon layer 810, followed by reactive ion etching of the buried silicon dioxide layer 812. This is the self-aligned patterning steps that are also depicted in FIGS. 4F-G. After patterning is complete, the two layers of photoresist on the top surface of the wafer are removed using solvents and polymer residues are etched away using plasma cleaning. In FIG. 6G, a dry film photoresist is laminated onto the wafer. This film is patterned lithographically, and the pattern transferred through the silicon dioxide layer 822, the silicon layer 810, the first buried oxide layer 812, and part-way through the silicon layer 814. This structure forms the basis for holes that will open early during the release etch process depicted in FIG. 6J. After defining the vent holes, FIG. 6H shows the removal of the dry photoresist film followed by the lithographic patterning and progressive etching of the layers 820, followed by 818, followed by 816. Layers 820 and 816 are etched using reactive ion etching, while layer 818 is etched using deep reactive ion etching. These etches are performed by processing the wafer upside-down relative to the orientation shown in FIG. 6H. In FIG. 6I, the photoresist layer used to pattern the bottom layers of the wafer is removed. The wafer is then mounted on a separate carrier wafer 836 using heat-release tape. The wafer is cut into individual rectangular dies using a diamond-blade dicing saw, and cleaned with deionized water. In FIG. 6J, the release etch is performed. In this step, the diced wafer/carrier wafer assembly is placed in a deep reactive-ion etch chamber, and exposed silicon is removed anisotropically. This etch removes the regions not protected by silicon dioxide masking layers 822 or 812, or aluminum layers 832A and 8328. There are two different etch-fronts that progress through silicon layer 814 at the same rate, but from different starting points. The result is two distinct etch completion times. The first etch completion time happens when the vent holes 806 release any gas trapped between the device wafer and the carrier wafer. Next, the etch completes in the spaces between the comb fingers as shown at 844 in FIG. 6J, freeing the MEMS structure to move.

In FIG. 6K, exposed areas of silicon dioxide are removed using anisotropic reactive ion etching. In FIG. 6L, a shadow mask is aligned to the wafer and fixed in place above it. The shadow mask consists of apertures patterned in a thin metal plate. This assembly is then placed in a vacuum chamber, where titanium followed by gold are deposited through the apertures using an e-beam evaporator tool to produce the mirror surface as shown at 848 in FIG. 6L. In FIG. 6M, the completed dies are removed from the temporary carrier wafer and inspected.

Contact pads 832A and 832B provide wire-bondable regions that provide reliable electrical connections. Traces 846 route electrical signals from these contact pads to comb-drive actuators. Self-aligned combs provide actuation in the vertical direction. The self-alignment provided by this process allows for tighter tolerances and greater symmetry of the comb finger and inter-finger gap widths, enabling higher actuator force density and a larger range of stable motion. Mirrors with front-surface gold coatings 848 provide high reflectivity over a large range of angles. This allows high-powered lasers of up to 1 W to illuminate the mirror without causing thermal damage.

FIGS. 6A-6M are somewhat different than the process in FIGS. 4-5. This difference comes from the incorporation of various steps to improve the manufacturability of the finished device, but is intended to maintain the primary benefits of the process described in FIGS. 4-5, namely, the self-aligned comb drives.

Importance of Self-Aligned Comb Teeth

The main benefits provided by the processes described in this patent come from the self-aligned comb teeth. These combs are used to create vertical comb drives with high force density and extended scan angles relative to combs without the self-aligned property. The increase in symmetry created by self-aligned process reduces the tendency to instability, where the mobile half-height combs move towards the closest full-height comb instead of moving in the vertical direction with the application of a high voltage potential between the stationary and moving comb teeth. High-performance comb drives provide benefits to all aspects of the device design. They allow for stiff hinges that can resist shock and vibration without sacrificing angular range of motion of the mirror surface. In the embodiment utilized in a high-speed optical switch the comb fingers have thicknesses of only 4 microns, and the spaces between the fingers are only 3 microns. In production runs, the variations of these dimensions can be controlled to within +1-0.2 microns. This precision is attributed directly to Applicants use of to a single mask to define the locations of the teeth and the spaces between them. The tight tolerances allow high-performance devices to be created, where the force created for a given voltage is substantially higher than in a device with wider spacing between comb fingers. Devices created in this process show angular range of motion of greater than 24 degrees at 250V, with resonant frequencies exceeding one kilohertz even with mirrors greater than 650 microns in diameter. In addition, the comb drives are compact, leading to tight packing of multiple mirrors on a die. Dies with spacing of 1.0 mm between adjacent mirrors are created in this process.

Also extremely important in this process is the use of the silicon wafer with the two buried silicon dioxide layers. These material discontinuities provide natural barriers to the various plasma and chemical etches described above. These built-in etch stops provide extreme dimensional control over the thickness of each structure. This translates into tight tolerances on the hinge, comb, and mirror thicknesses, yielding repeatable performance from die to die.

Other Applications

Persons skilled in this art will recognize from these description and the cross-section views of FIGS. 6A through 6M that many different types of structures can be built with this process. MEMS devices, including mirrors such as the one described in this specification can be used in a variety of applications. These applications include optical raster scanning of one or two directions, and vector pointing. Examples of raster scanning applications include television, optical coherence tomography, lidar (laser RADAR), cameras, and lithography. Examples of vector pointing include fast beam-steering, free-space optical communication, and image stabilization. The invention can also be used to fabricate confocal microscopes and optical tweezers.

VARIATIONS

The present invention has been described above in terms of specific embodiments. Persons skilled in the art will recognize that many variations of the present invention are possible. For example, many other types of devices could be fabricated utilizing semiconductor substrates with buried insulator layers where close tolerances are needed. It is not required that photoresist be used as the sole masking layer to define the regions of the wafer to be etched. Alternatives include using sufficient silicon dioxide hard mask to withstand all etches, or a second hard mask material, such as chrome or other etch mask material, that can be used to increase the etch resistance of the hard mask. Other hard mask materials could include: silicon oxynitride, silicon dioxide, silicon nitride, silicon carbide, chromium, aluminum, titanium, and tungsten. These hard mask materials can either be grown on the top surface of the wafer through oxidation or other growth processes, or deposited using physical, vapor, or plasma-enhanced deposition techniques. Therefore, the scope of the present invention should not be limited to the above described preferred embodiments, but by the appended claims and their legal equivalence.

What is claimed is:

1. A process of fabricating a MEMS device in or on a substrate comprised of at least two silicon layers, defining an upper semi-conductor layer and an intermediate semi-conductor layer, and at least one additional semiconductor layer, defining a bottom semiconductor layer; the upper semiconductor layer and the intermediate semiconductor layer and the bottom semiconductor layer being separated by at least two insulator layers defining an upper buried insulator layer and a lower buried insulator layer; said process comprising the steps of:
A) applying a hardmask material to the upper semi-conductor layer and etching the hardmask material utilizing a first photoresist pattern to form overwidth hardmask portions for etching full height comb teeth,
B) forming a second photoresist pattern on the overwidth hardmask portions to define location and a cross section of the full height comb teeth and on portions of the upper semi-conductor layer between the overwidth hardmask portions to define location and a cross section of fractional height comb teeth and to define distances between the full height and fractional height comb teeth,
C) removing excess portions of the overwidth hardmask portions utilizing the second photoresist pattern and then etching away the unmasked portions of the upper semi-conductor layer utilizing the second photoresist pattern forming deep gaps in the upper semi-conductor layer with the upper buried insulator layer acting as an etch stop material for the upper semi-conductor layer etch to define exposed portions of the upper buried insulator layer, and then removing the exposed portion of the upper buried insulator layer; and
D) after removal of the exposed portion of the upper buried insulator layer and the second photoresist pattern, etching exposed regions of the upper and second intermediate semiconductor layers, defining: (i) the full height comb teeth comprising portions of the upper semiconductor layer and the intermediate semiconductor layer separated by portions of the upper buried insulator layer and (ii) the fractional height comb teeth comprising portions of the intermediate semiconductor layer with vertical gaps between the full height comb teeth and the fractional height comb teeth.

2. The process as in claim 1 comprising performing a backside etch to etch portions of the bottom semiconductor layer and the lower buried insulator layer to permit the fractional height teeth to move relative to the full height comb teeth.

3. The process of claim 1 wherein the full height comb teeth comprising portions of the upper semiconductor layer and the intermediate semiconductor layer separated by portions of the upper buried insulator layer define stationary comb teeth and the fractional height comb teeth comprising portions of the intermediate semiconductor layer define movable comb teeth.

4. The process of claim 1 wherein the bottom semiconductor layer is comprised of silicon.

5. The process of claim 1 wherein the at least two silicon layers are comprised of p or n doped single crystal silicon.

6. The process of claim 1 wherein the bottom semiconductor layer is comprised of p-type single crystal silicon.

7. The process of claim 1 wherein the hardmask material is chosen from a group of hardmask materials consisting of silicon oxide, silicon oxynitride and silicon nitride.

8. The process of claim 1 wherein the hardmask material is silicon oxide.

9. The process of claim 1 wherein the insulator layers are utilized to define the height of comb teeth.

10. The process of claim 1 wherein the hardmask material and the first photoresist pattern and the second photoresist pattern are utilized to define a single pattern defining locations of full height comb teeth and fractional height comb teeth.

11. A process as in claim 1 wherein deep trench reactive ion etch is utilized to etch both the upper semiconductor layer and the intermediate semiconductor layer to ensure well defined vertical etch profiles with said hard mask layer acting as an etch stop material for the silicon etch process.

12. The process of claim 1 wherein the second photo resist pattern is transferred to a the overwidth hardmask to create a mask of the hardmask material for subsequent etch steps.

13. The process of claim 12 wherein the hardmask material is chosen from a group of hardmask materials consisting of: silicon dioxide, silicon nitride, silicon carbide, chromium, aluminum, titanium, and tungsten.

14. The process of claim 12 wherein the hardmask material is a multi-layer composite consisting of two or more of the materials chosen from a group of materials consisting of: silicon dioxide, silicon nitride, silicon carbide, chromium, aluminum, titanium, and tungsten.

* * * * *